US012592522B2

(12) United States Patent
Kao et al.

(10) Patent No.: US 12,592,522 B2
(45) Date of Patent: Mar. 31, 2026

(54) CONNECTOR ASSEMBLY

(71) Applicant: Molex, LLC, Lisle, IL (US)

(72) Inventors: Ming-Huei Kao, New Taipei (TW);
Kuan-Chih Huang, New Taipei (TW);
Vivek Shah, Buffalo Grove, IL (US);
Saiyed Muhammad Hasan Ali,
Conway, AR (US); Hui-Hsuan Yang,
New Taipei (TW); Kuan-Lin Peng,
New Taipei (TW); Wei-Cheng Lin,
New Taipei (TW)

(73) Assignee: Molex, LLC, Lisle, IL (US)

( * ) Notice: Subject to any disclaimer, the term of this
patent is extended or adjusted under 35
U.S.C. 154(b) by 357 days.

(21) Appl. No.: 18/098,728

(22) Filed: Jan. 19, 2023

(65) Prior Publication Data

US 2023/0246396 A1     Aug. 3, 2023

Related U.S. Application Data

(60) Provisional application No. 63/304,280, filed on Jan.
28, 2022.

(30) Foreign Application Priority Data

Aug. 24, 2022     (CN) .......................... 202211021149.9

(51) Int. Cl.
*H01R 13/6583*     (2011.01)
*H01R 13/508*     (2006.01)
*H05K 7/20*     (2006.01)
(52) U.S. Cl.
CPC ....... *H01R 13/6583* (2013.01); *H01R 13/508*
(2013.01); *H05K 7/20418* (2013.01)

(58) Field of Classification Search
CPC ............ H01R 13/6583; H01R 13/6587; H01R
12/721; H01R 13/7172; H01R 13/6594;
H05K 7/02418; H05K 9/0058
See application file for complete search history.

(56) References Cited

U.S. PATENT DOCUMENTS

| | | | | |
|---|---|---|---|---|
| 2020/0275587 A1 * | 8/2020 | Chopra | ................ | G02B 6/4277 |
| 2020/0295498 A1 * | 9/2020 | Lloyd | .................. | H01R 13/658 |
| 2021/0098926 A1 | 4/2021 | Duan et al. | | |

FOREIGN PATENT DOCUMENTS

| | | |
|---|---|---|
| CN | 204257893 U | 4/2015 |
| CN | 106469878 A | 3/2017 |

(Continued)

*Primary Examiner* — Renee S Luebke
*Assistant Examiner* — Paul D Baillargeon

(57) ABSTRACT

A connector assembly includes a guiding shield cage, a
receptacle connector, a partitioning bracket and a movable
heat sink. The receptacle connector is provided to a rear
segment of an interior of the guiding shield cage, the
receptacle connector has an upper receptacle and a lower
receptacle. The partitioning bracket is provided in the guid-
ing shield cage, the partitioning bracket and the guiding
shield cage together define an upper receiving space which
corresponds to the upper receptacle and a lower receiving
space which corresponds to the lower receptacle. The mov-
able heat sink is assembled to the partitioning bracket, the
movable heat sink is capable of moving relative to the
partitioning bracket between a front position where the
movable heat sink is positioned in front of a front end of the
upper receptacle a front end of the lower receptacle and a
rearward position where the movable heat sink at least
partially enters into between the upper receptacle and the
lower receptacle.

24 Claims, 26 Drawing Sheets

(56)         References Cited

FOREIGN PATENT DOCUMENTS

| | | | |
|---|---|---|---|
| CN | 113574980 | A | 10/2021 |
| TW | 202137650 | A | 10/2021 |
| TW | 202203522 | A | 1/2022 |
| WO | 2016105567 | A1 | 6/2016 |

* cited by examiner

CONNECTOR ASSEMBLY

RELATED APPLICATIONS

This application claims priority to U.S. Patent Application No. 63/304,280, filed on Jan. 28, 2022 and Chinese Patent Application Serial No. 202211021149.9, filed Aug. 24, 2022, both of which are incorporated herein by reference in their entireties.

TECHNICAL FIELD

The present disclosure relates to a connector assembly, and particularly relates to a connector assembly having a partitioning bracket.

BACKGROUND

Chinese invention patent application publication No. CN106469878A (corresponding to U.S. Pat. No. 10,153,571B2) discloses a connector system, the connector system includes a cage and a biased heat sink. The cage includes an intermediate section, the intermediate section includes an upper wall and a lower wall, the upper wall and the lower wall help to define an upper port and a lower port in the cage, the lower wall includes a hole formed therein so that the intermediate section and the lower port are communicated with each other, the biased heat sink is arranged in the intermediate section between the upper port and the lower port, the biased heat sink extends through the hole and enters into the lower port. The cage disclosed in this prior art is positioned over a stacked connector, an opening formed to a bottom portion of the cage allows the stacked connector to be capable of being arranged inside the cage, a rear end of the intermediate section is necessary to extend to between an upper receptacle and a lower receptacle of the stacked connector. However, in an assembling case that the stacked connector needs to be mounted on a circuit board in advance, the intermediate section of the cage which is assembled later will interfere with the stacked connector, which makes the cage to be assembled later cannot be assembled.

Chinese utility model patent application issuance publication No. CN204257893U discloses a partitioning plate portion which is fixed in a metal shell and is positioned between two receiving cavities, the partitioning plate portion includes two partitioning plates which are respectively exposed into the two receiving cavities, the two partitioning plates interpose a metal heat dissipating block, the two partitioning plates are provided with heat dissipating holes which pass through the two partitioning plates respectively and are used to be respectively communicated with the two receiving cavities and the metal heat dissipating block, the metal heat dissipating block includes a main body portion which is used to attach with the two partitioning plates and a snapping protrusion which extends rearwardly from the main body portion and is inserted into and positioned to an insulative body. Although this prior art discloses the snapping protrusion which extends rearwardly from the metal heat dissipating block positioned in the partitioning plate portion and is inserted into and positioned to the insulative body of a connector, in an assembling case that the connector needs to be mounted on a circuit board in advance, the partitioning plate portion of the metal shell which is assembled later will interfere with the connector, which makes the metal shell to be assembled later cannot be assembled. In this case, although that the metal heat dissipating block is directly cut short may solve this assembling interference problem, heat dissipating efficacy will be relatively lowered.

SUMMARY

Therefore, an object of the present disclosure is to provide a connector assembly which can improve at least one problem of the prior art.

Accordingly in some embodiments, a connector assembly of the present disclosure comprises a guiding shield cage, a receptacle connector, a partitioning bracket and a movable heat sink. The receptacle connector is provided to a rear segment of an interior of the guiding shield cage, the receptacle connector has an upper receptacle and a lower receptacle. The partitioning bracket is provided in the guiding shield cage, the partitioning bracket and the guiding shield cage together define an upper receiving space which corresponds to the upper receptacle and a lower receiving space which corresponds to the lower receptacle. The movable heat sink is assembled to the partitioning bracket, the movable heat sink is capable of moving relative to the partitioning bracket between a front position where the movable heat sink is positioned in front of a front end of the upper receptacle a front end of the lower receptacle and a rearward position where the movable heat sink at least partially enters into between the upper receptacle and the lower receptacle.

In some embodiments, guiding members and guiding rail grooves are provided between two side walls of the movable heat sink and two side walls of the guiding shield cage, the guiding members are respectively provided to the guiding rail grooves in a manner that the guiding members can slide forwardly or rearwardly.

In some embodiments, the two side walls of the movable heat sink have the guiding members, the two side walls of the guiding shield cage have the guiding rail grooves.

In some embodiments, two side walls of the partitioning bracket have guiding member receiving notches which are positioned to rear ends of the two side walls of the partitioning bracket respectively, when the movable heat sink is positioned in the front position, the guiding members are received the guiding member receiving notches respectively.

In some embodiments, the connector assembly comprises holding members, two side walls of the movable heat sink have first holding portions which latch with the holding members respectively when the movable heat sink is in the front position and second holding portions which latch with the holding members respectively when the movable heat sink is in the rearward position.

In some embodiments, the holding members are elastic holding pieces which are constructed on two side walls of the guiding shield cage or two side walls of the partitioning bracket, the two side walls of the movable heat sink each are formed with a first recessed groove and a second recessed groove which is positioned in front of the first recessed groove, the first holding portions are front ends of the first recessed grooves constructed on the two side walls of the movable heat sink, the second holding portions are rear ends of the second recessed grooves constructed on the two side walls of the movable heat sink.

In some embodiments, the two side walls of the guiding shield cage or the two side walls of the partitioning bracket have limiting pieces which correspondingly enter into the first recessed grooves; when the movable heat sink positioned in the front position, the limiting pieces are positioned to rear ends of the first recessed grooves respectively; when the movable heat sink is positioned in the rearward position, the limiting pieces are positioned to front ends of the first recessed groove.

In some embodiments, the two side walls of the guiding shield cage have the elastic holding pieces and the limiting pieces, the two side walls of the partitioning bracket each have avoiding openings which allow the corresponding elastic holding piece and the corresponding limiting piece to pass through respectively.

In some embodiments, the movable heat sink has a lower stopping portion which enters into the lower receiving space, when the movable heat sink is in the front position, a pluggable module which enters into the lower receiving space is capable of pushing the lower stopping portion so that the movable heat sink is rearwardly moved to the rearward position.

In some embodiments, the connector assembly further comprising side heat sinks, the side heat sinks are positioned to outer sides of the two side walls of the guiding shield cage respectively and are assembled to the two side walls of the movable heat sink in a manner that the side heat sinks move together with the movable heat sink.

In some embodiments, the movable heat sink comprises a movable heat dissipating member and a movable pressure-applying spring, the movable pressure-applying spring applies an elastic force to the movable heat dissipating member so that the movable heat dissipating member is capable of being elastically moved upwardly or downwardly relative to the partitioning bracket.

In some embodiments, the movable pressure-applying spring is assembled to the movable heat dissipating member and moves together with the movable heat dissipating member, the movable pressure-applying spring is positioned between the movable heat dissipating member and an upper wall of the partitioning bracket, the movable pressure-applying spring has a plurality of plate-shaped spring pieces which press against the upper wall of the partitioning bracket.

Accordingly in some embodiments, a connector assembly of the present disclosure comprises a guiding shield cage, a receptacle connector, a partitioning bracket, an internal heat sink and a movable heat sink. The receptacle connector is provided to a rear segment of an interior of the guiding shield cage, the receptacle connector has an upper receptacle and a lower receptacle. The partitioning bracket is provided in the guiding shield cage, the partitioning bracket and the guiding shield cage together define an upper receiving space which corresponds to the upper receptacle and a lower receiving space which corresponds to the lower receptacle. The internal heat sink is provided in the partitioning bracket. The movable heat sink is assembled to a rear end of the partitioning bracket and positioned behind the internal heat sink, the movable heat sink is capable of moving relative to the partitioning bracket between a front position where the movable heat sink is positioned in front of a front end of the upper receptacle a front end of the lower receptacle and a rearward position where the movable heat sink at least partially enters into between the upper receptacle and the lower receptacle.

In some embodiments, guiding members and guiding rail grooves are provided between two side walls of the movable heat sink and two side walls of the guiding shield cage, the guiding members are respectively provided to the guiding rail grooves in a manner that the guiding members can slide forwardly or rearwardly.

In some embodiments, the two side walls of the movable heat sink have the guiding members, the two side walls of the guiding shield cage have the guiding rail grooves.

In some embodiments, two side walls of the partitioning bracket have guiding member receiving notches which are positioned to rear ends of the two side walls of the partitioning bracket respectively, when the movable heat sink is positioned in the front position, the guiding members are received the guiding member receiving notches respectively.

In some embodiments, the connector assembly comprises holding members, two side walls of the movable heat sink have first holding portions which latch with the holding members respectively when the movable heat sink is in the front position and second holding portions which latch with the holding members respectively when the movable heat sink is in the rearward position.

In some embodiments, the holding members are elastic holding pieces which are constructed on two side walls of the guiding shield cage respectively, the first holding portions are limiting holes which are constructed on the two side walls of the movable heat sink respectively, the second holding portions are front edge which are constructed on the two side walls of the movable heat sink respectively.

In some embodiments, the two side walls of the movable heat sink have limiting grooves, the two side walls of the guiding shield cage or the two side walls of the partitioning bracket have limiting pieces which correspondingly enter into the limiting grooves; when the movable heat sink is positioned in the front position, the limiting pieces are positioned to rear ends of the limiting grooves respectively; when the movable heat sink is positioned in the rearward position, the limiting pieces are positioned to front ends of the limiting grooves respectively.

In some embodiments, the two side walls of the guiding shield cage have the limiting pieces which correspondingly enter into the limiting grooves, the two side walls of the partitioning bracket each have avoiding openings which respectively allow the corresponding elastic holding pieces and the corresponding limiting piece to pass through.

In some embodiments, the movable heat sink has a lower stopping portion which enters into the lower receiving space, when the movable heat sink is in the front position, a pluggable module which enters into the lower receiving space is capable of pushing the lower stopping portion so that the movable heat sink is rearwardly moved to the rearward position.

In some embodiments, the movable heat sink comprises a movable heat dissipating member and a movable pressure-applying spring, the movable pressure-applying spring comprises a movable supporting frame and a movable pressure-applying elastic piece, the movable heat dissipating member is assembled in the movable supporting frame, the movable supporting frame has an upper wall and two side walls, the movable pressure-applying elastic piece is provided to the upper wall of the movable supporting frame, and applies an elastic force to the movable heat dissipating member so that the movable heat dissipating member is capable of being elastically moved upwardly or downwardly relative to the movable supporting frame and the partitioning bracket, two side walls of the movable supporting frame are constructed the two side walls of the movable heat sink.

In some embodiments, the movable heat sink comprises a movable heat dissipating member and a movable pressure-applying spring, the movable heat dissipating member has a base and heat dissipating fins, the base has a lower wall and two side walls, the movable pressure-applying spring is positioned between the movable heat dissipating member and an upper wall of the partitioning bracket and applies an elastic force to the movable heat dissipating member so that the movable heat dissipating member is capable of being elastically moved upwardly or downwardly relative to the partitioning bracket, two side walls of the base are constructed as the two side walls of the movable heat sink.

In some embodiments, the internal heat sink comprises an internal heat dissipating member and an internal pressure-applying spring, the internal pressure-applying spring is positioned between the internal heat dissipating member and an upper wall of the partitioning bracket, and applies an elastic force to the internal heat dissipating member so that the internal heat dissipating member is capable of being elastically moved upwardly or downwardly relative to the partitioning bracket.

In the present disclosure, by the movable heat sink which is assembled in the partitioning bracket and can move to the front position where the movable heat sink is positioned in front of the upper receptacle and the lower receptacle, the partitioning bracket and the movable heat sink do not interfere with the receptacle connector when the partitioning bracket and the movable heat sink are assembled. After the assembling is completed, the movable heat sink is moved rearwardly to the rearward position where the movable heat sink enters into between the upper receptacle and the lower receptacle of the receptacle connector, by that the movable heat sink moves toward the receptacle connector, a distance for heat dissipating function can be lengthened and a range where heat dissipating is performed is enlarged, in turn heat dissipating efficacy is promoted.

BRIEF DESCRIPTION OF THE DRAWINGS

Other features and effects of the present disclosure will be apparent from an embodiment illustrated in the drawings, in which.

DETAILED DESCRIPTION OF THE PREFERRED EMBODIMENTS

Figure 1:
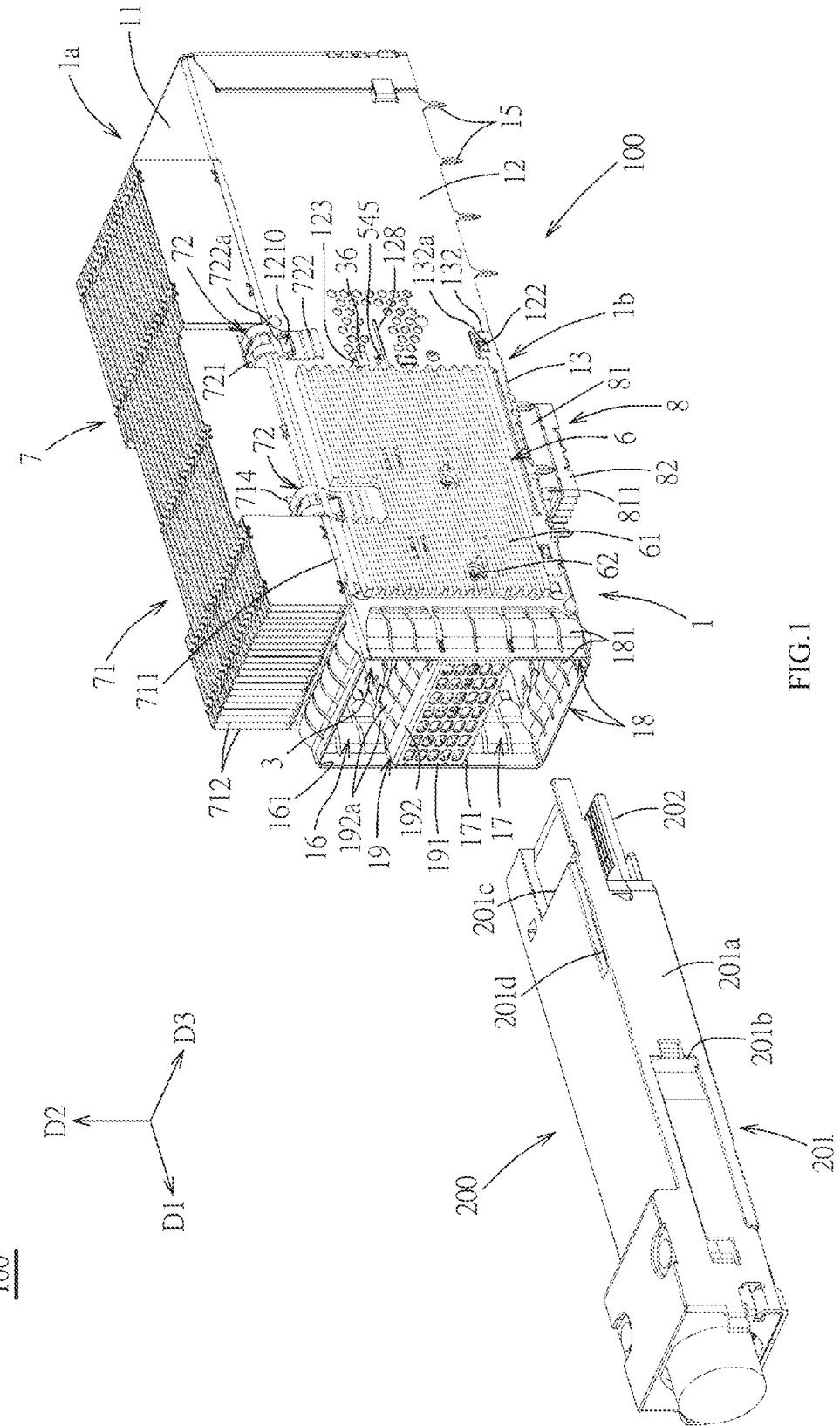
FIG. 1 is a perspective view of a first embodiment of a connector assembly of the present disclosure and a pluggable module.

Before the present disclosure is described in detail, it is noted that like elements are represented by the same reference numerals in the following description.

Figure 2:
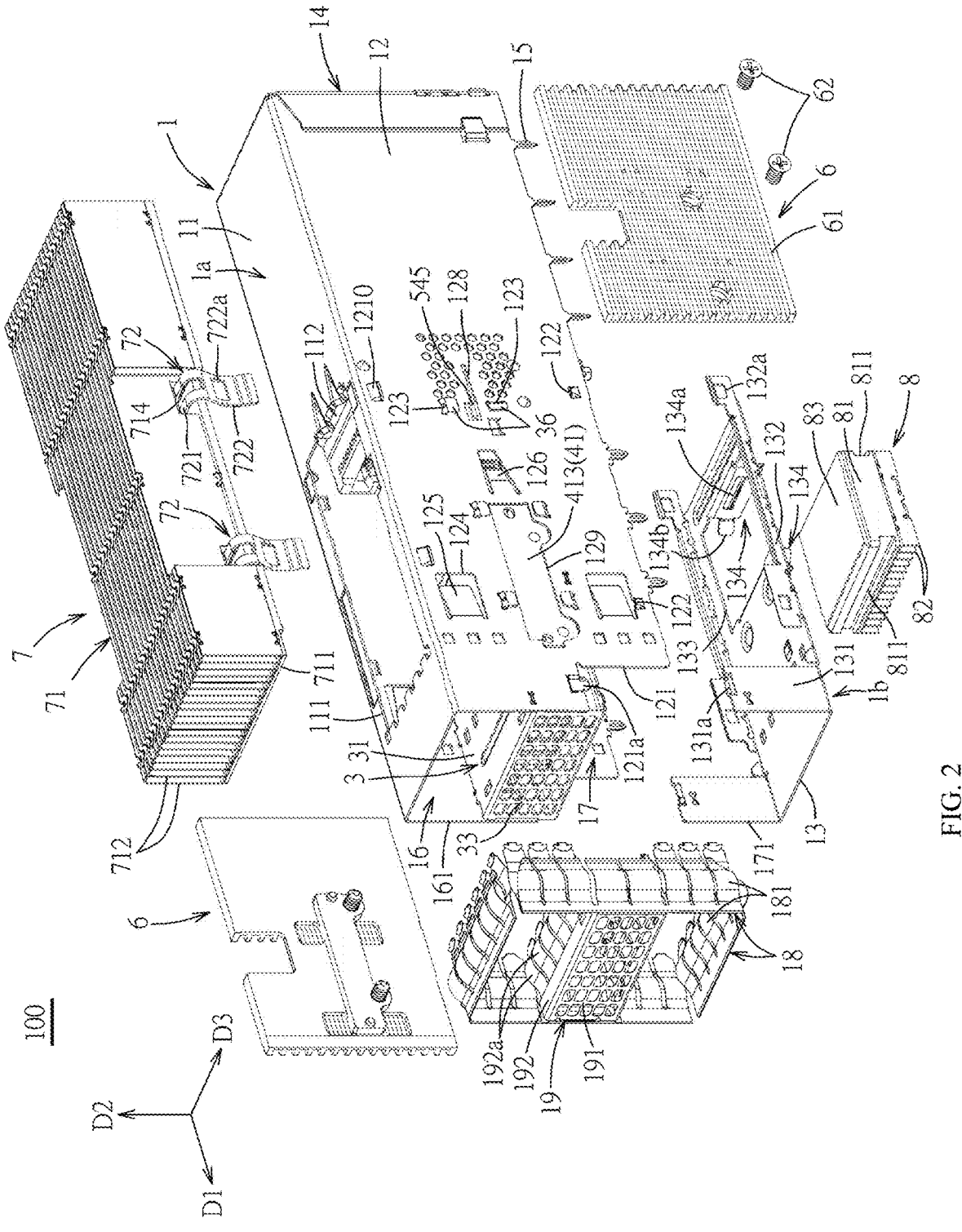
FIG. 2 is a perspective exploded view of the first embodiment.

Referring to FIG. 1 and FIG. 2, a first embodiment of a connector assembly 100 of the present disclosure is adapted to be provided with a circuit board (not shown) and is adapted to mate with a pluggable module 200. The connector assembly 100 includes a guiding shield cage 1, a receptacle connector 2, a partitioning bracket 3, an internal heat sink 4, a movable heat sink 5, two side heat sinks 6, an upper heat sink 7 and a lower heat dissipating member 8.

The guiding shield cage 1 for example is formed by processing, such as stamping and bending, a metal plate. The guiding shield cage 1 extends along a front-rear direction D1 (a direction to which an arrow points is front, and an opposite direction is rear), and has a top wall 11 which is positioned to the up in an up-down direction D2 (a direction to which an arrow points is up, and an opposite direction is down), two side walls 12 which extend downwardly from two sides of the top wall 11 respectively and face each other in a left-right direction D3 (a direction to which an arrow points is right, and an opposite direction is right), a bottom wall 13 which is connected to front segments of bottom edges of the two side walls 12, a rear wall 14 which is connected to a rear edge of the top wall 11 and rear edges of the two side walls 12, and a plurality of pressing fit legs 15 which are formed to the bottom edges of the two side walls 12 and a bottom edge of the rear wall 14, the plurality of pressing fit legs 15 are used to press into a plurality of pressing fit holes of the circuit board respectively so that the guiding shield cage 1 is fixedly provided to the circuit board and may be electrically connected to a ground wiring of the circuit board.

In the first embodiment, the guiding shield cage 1 includes an upper shell 1*a* and a lower shell 1*b* which are assembled with each other, the upper shell 1*a* has the top wall 11 and the two side walls 12 which are integrally connected with each other, the lower shell 1*b* has the bottom wall 13, and the lower shell 1*b* is provided to the two side walls 12 of the upper shell 1*a* by assembling. A recessed portion 121 is formed to the bottom edge of each side wall 12 of the upper shell 1*a* close to a front end of each side wall 12, and each side wall 12 are outwardly formed with a plurality of latching blocks 122. The bottom wall 13 of the lower shell 1*b* is integrally upwardly formed with two protruding portions 131 which correspondingly cooperate with the two recessed portions 121 of the two side walls 12 respectively and two side assembling portions 132 which are correspondingly assembled to outer sides of the two side walls 12 respectively. The recessed portion 121 is provided with a front inserting portion 121*a*, the protruding portion 131 is provided with a front inserting hole 131*a* which correspondingly cooperates with the front inserting portion 121*a*, the front inserting portion 121*a* inserts into the front inserting hole 131*a*, each side assembling portion 132 is formed with a plurality of latching holes 132*a* which latch with the plurality of latching blocks 122 of the corresponding side wall 12, so that the bottom wall 13 of the lower shell 1*b* can be assembled and engaged with the two side walls 12 of the upper shell 1*a*.

Figure 3:
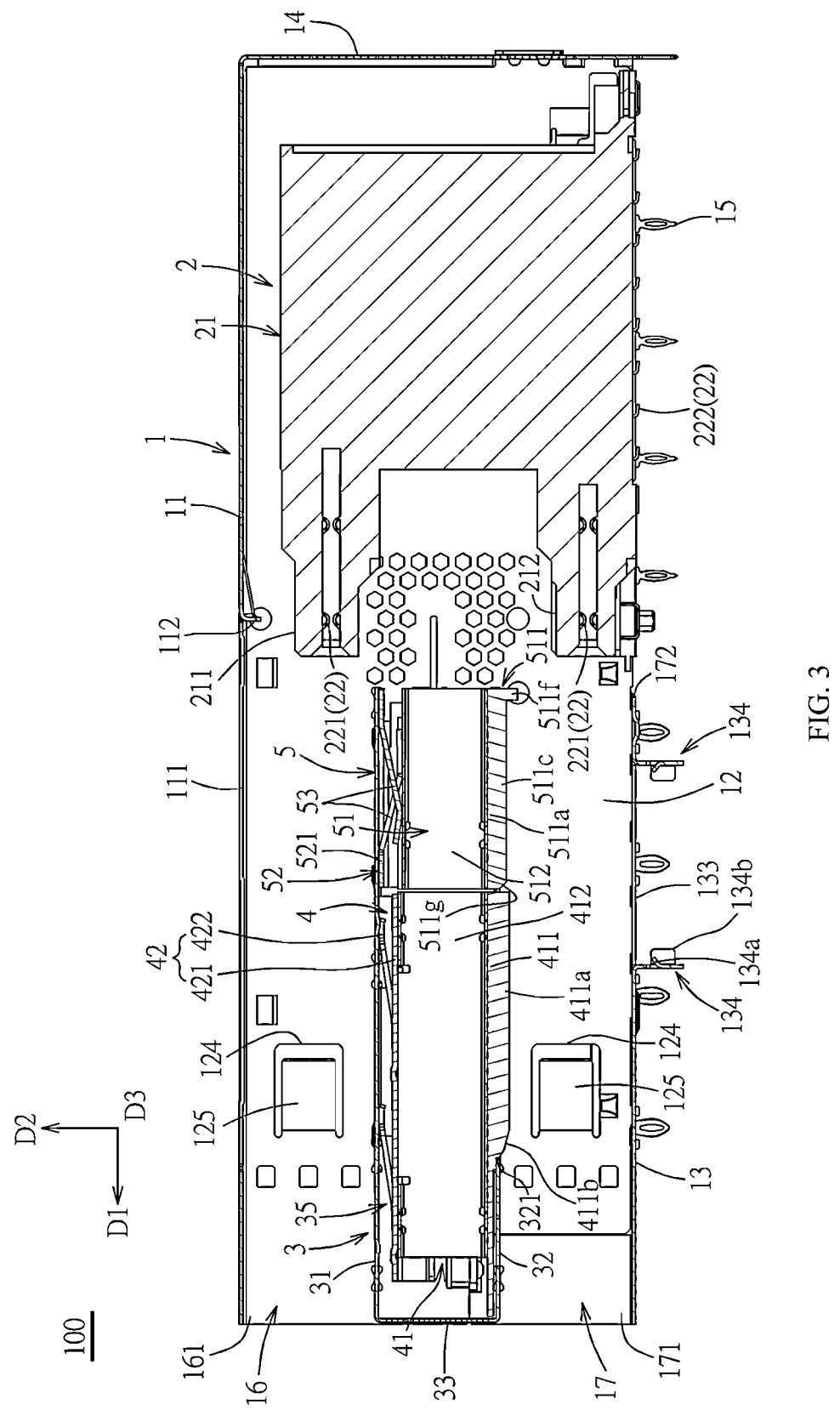
FIG. 3 is a cross sectional view of the first embodiment with an upper heat sink and a lower heat dissipating member omitted and a movable heat sink positioned in a front position.
Figure 4:
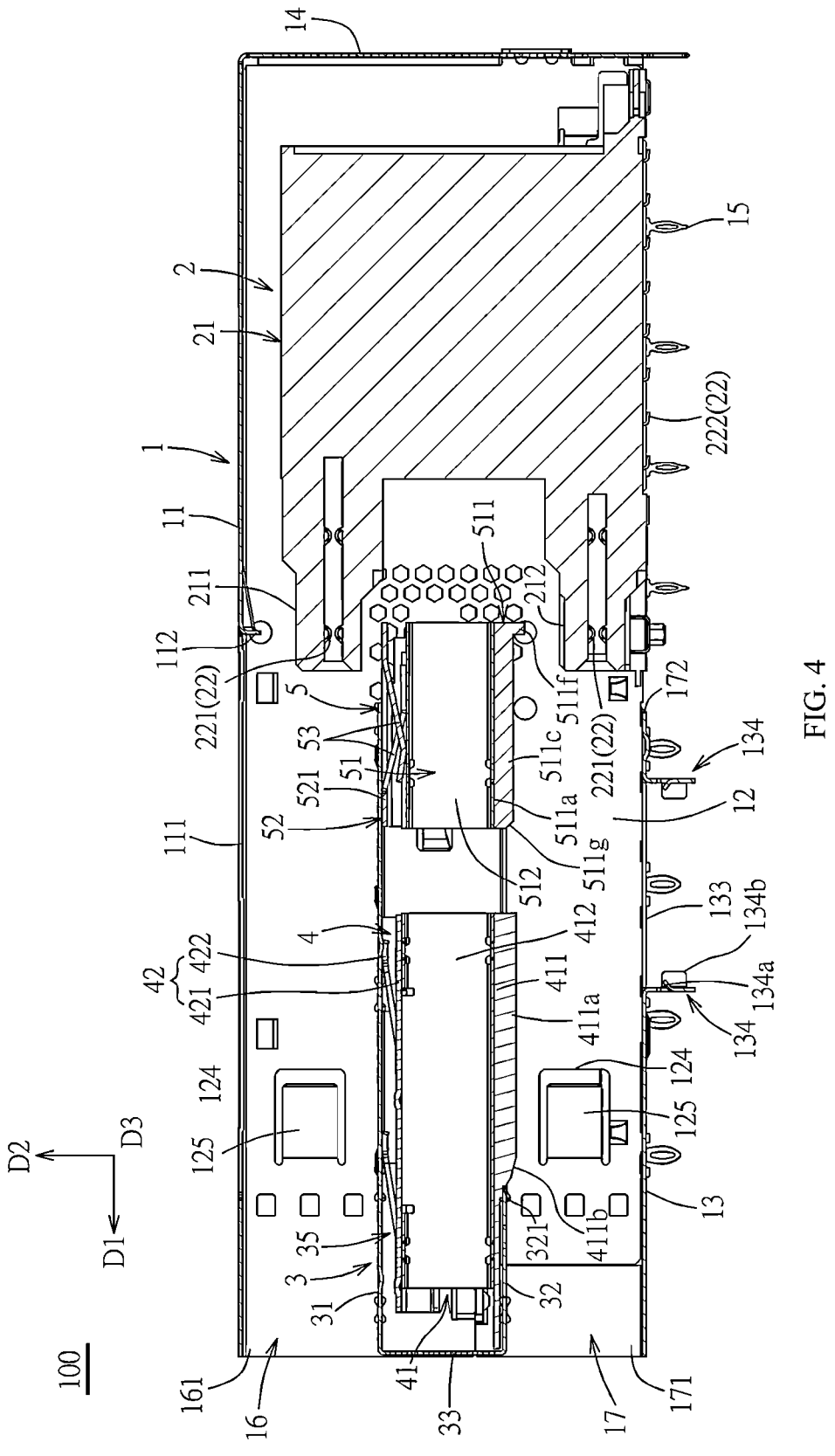
FIG. 4 is a cross sectional view of the first embodiment with the upper heat sink and the lower heat dissipating member omitted and the movable heat sink positioned in a rearward position.
Figure 5:
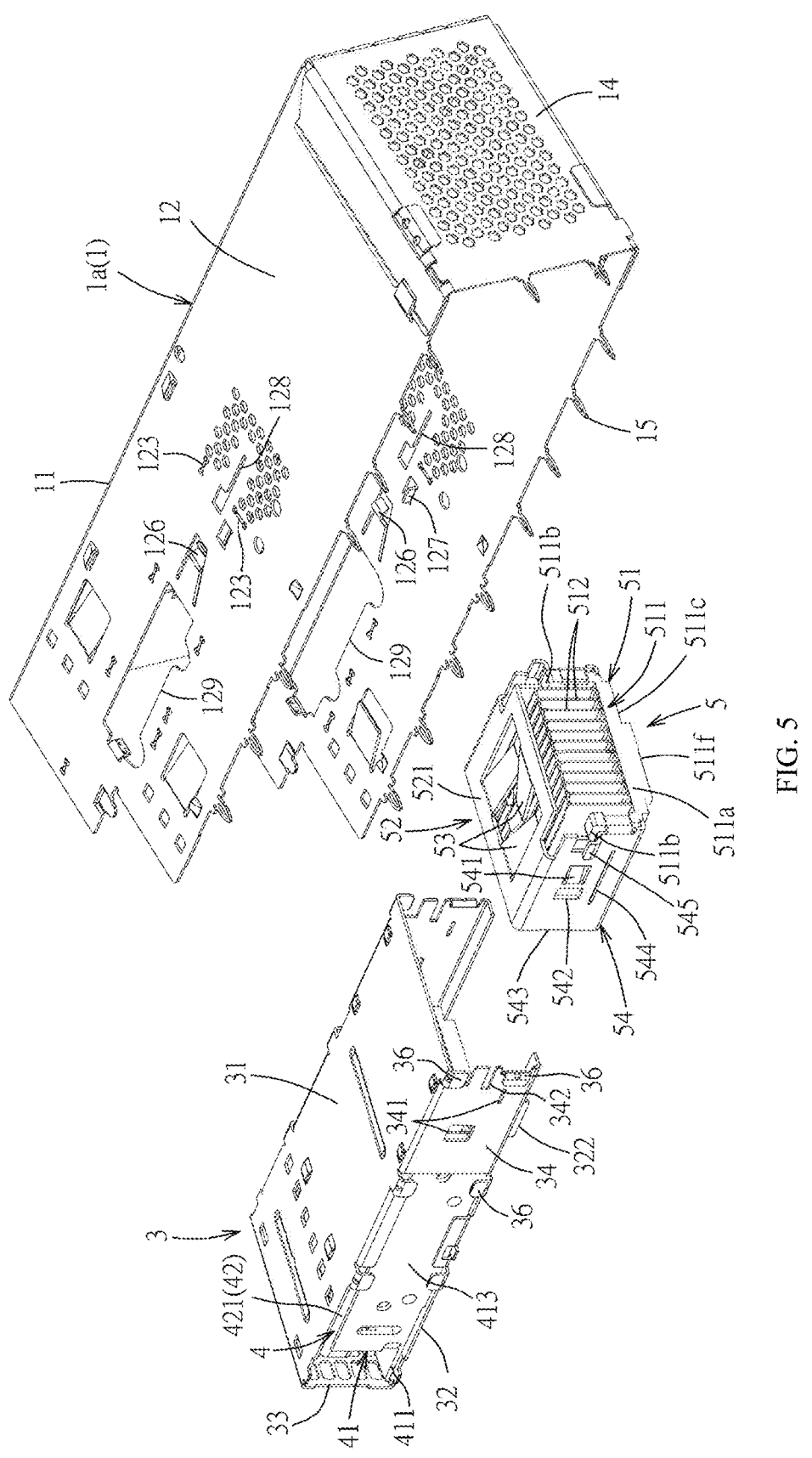
FIG. 5 is a perspective exploded view of a guiding shield cage, a partitioning bracket, an internal heat sink and the movable heat sink of the first embodiment.

Referring to FIG. 3, the receptacle connector 2 is provided on the circuit board and is provided to a rear segment of an interior of the guiding shield cage 1, the receptacle connector 2 has a housing 21 which is insulative and a plurality of terminals 22 which are provided to the housing 21, the housing 21 has an upper receptacle 211 and a lower receptacle 212 which are toward the front and are arranged along the up-down direction D2, each terminal 22 has a contacting portion 221 which is positioned in the upper receptacle 211 or the lower receptacle 212 and a tail portion 222 which downwardly extends out of a bottom portion of the housing 21 and is used to be mechanically and electrically connected to the circuit board, the tail portion 222 of the embodiment constitutes a surface mounting form, however also may be constructed as a through-hole welding form.

Referring to FIG. 1, FIG. 2 and FIG. 4 to FIG. 7, the partitioning bracket 3 is provided in the guiding shield cage 1, and the partitioning bracket 3 and the guiding shield cage 1 together define an upper receiving space 16 which corresponds to the upper receptacle 211 of the receptacle connector 2 and a lower receiving space 17 which corresponds to the lower receptacle 212 of the receptacle connector 2, a rear segment of the upper receiving space 16 and a rear segment of the lower receiving space 17 are communicated with each other so as to provide a space of a rear segment of the guiding shield cage 1 which is used to receive the receptacle connector 2. The upper receiving space 16 has an upper inserting port 161 which is positioned in the front of the upper receiving space 16 and allows the pluggable module 200 to insert therein, the lower receiving space 17 has a lower inserting port 171 which is positioned in the front of the lower receiving space 17 and allows the pluggable module 200 to insert therein and a bottom opening 172 which is positioned at the rear of a bottom portion of the lower receiving space 17 and is defined together by the two side walls 12, the bottom wall 13 and the rear wall 14 of the guiding shield cage 1, the bottom opening 172 allows the receptacle connector 2 to enter into from down to up so that the receptacle connector 2 is received in the rear segment of the interior of the guiding shield cage 1. In the first embodiment, the partitioning bracket 3 has an upper wall 31 and a lower wall 32 which face each other in the up-down direction, a front wall 33 which is connected to a front edge of the upper wall 31 and a front edge of the lower wall 32, and two side walls 34 which are connected to rear segments of side edges of the upper wall 31 and rear segments of side edges of the lower wall 32, the upper wall 31, the lower wall 32, the front wall 33 and the two side walls 34 together define an internal receiving space 35. Each side wall 12 of the guiding shield cage 1 has a fixing hole 123 which is penetratingly formed, the partitioning bracket 3 further has fixing bendable pieces 36 which extend to outer sides of the two side walls 12 respectively, the fixing bendable pieces 36 respectively pass through the fixing holes 123 of the two side walls 12 and then are bent and fixed, so that the partitioning bracket 3 is stably assembled to the guiding shield cage 1.

In the first embodiment, the connector assembly 100 may be provided to a mounting hole (not shown) of a casing (not shown), the guiding shield cage 1 is provided with a plurality of first grounding members 18 which is positioned at a front end of the guiding shield cage 1, the partitioning bracket 3 is further provided with a second grounding member 19 which is positioned at the front wall 33 and a front segment of the upper wall 31 and a front segment of the lower wall 32. The plurality of first grounding members 18 have a plurality of first elastic fingers 181 which extend rearwardly from the front end of the guiding shield cage 1 and are distributed to an outer side of the guiding shield cage 1 and an inner side of the guiding shield cage 1, the first elastic finger 181 of the plurality of first elastic fingers 181 which is positioned at the outer side of the guiding shield cage 1 is used to contact an edge of the mounting hole of the casing, the first elastic finger 181 of the plurality of first elastic fingers 181 which is positioned at the inner side of the guiding shield cage 1 is used to contact the pluggable module 200. The second grounding member 19 has a piece body 191 which is provided to a front side surface of the front wall 33 of the partitioning bracket 3 and two grounding pieces 192 which rearwardly extend respectively from an upper edge of the piece body 191 and a lower edge of the piece body 191 so as to respectively enter into the upper receiving space 16 and the lower receiving space 17. Each grounding piece 192 has a plurality of second elastic fingers 192*a* which extend rearwardly and are used to contact the pluggable module 200, the second elastic finger 192*a* of the plurality of second elastic fingers 192*a* which enters into the upper receiving space 16 is provided to the front segment of the upper wall 31, the second elastic finger 192*a* of the plurality of second elastic fingers 192*a* which enters into the lower receiving space 17 is provided to the front segment of the lower wall 32.

The pluggable module 200 has a shell member 201 and a mating circuit board 202. The shell member 201 has an inserting portion 201*a* which is used to insert into the upper receiving space 16 or the lower receiving space 17, the mating circuit board 202 protrudes from the inserting portion 201*a*, is provided to the inserting portion 201*a* and is used to insert into the upper receptacle 211 or the lower receptacle 212. Each side wall 12 of the guiding shield cage 1 has two openings 124 which respectively correspond to the upper receiving space 16 and the lower receiving space 17, an inward extending elastic piece 125 is constructed at each opening 124 and extends rearwardly and obliquely toward the interior of the guiding shield cage 1. A left side and a right side of the inserting portion 201*a* of the pluggable module 200 each are provided with a locking recessed groove 201*b* which correspondingly cooperates with the inward extending elastic piece 125, the inward extending elastic pieces 125 at the openings 124 are used to cooperate with the locking recessed grooves 201*b* of the pluggable module 200 which inserts into the upper receiving space 16 or the lower receiving space 17, so as to generate locking effect. In addition, an aligning structure 201*c* is further formed at a top portion of a front end of the inserting portion 201*a* of the shell member 201. The top wall 11 of the guiding shield cage 1 is formed with an upper window 111 which is communicated with the upper receiving space 16 and an upper stopping portion 112 which extends downwardly into the upper receiving space 16 from a rear segment of the upper window 111, the upper stopping portion 112 is used to stop the aligning structure 201*c* so as to limit an inserting position of the pluggable module 200. The lower wall 32 of the partitioning bracket 3 is formed with a lower window 321 which makes the internal receiving space 35 communicated with the lower receiving space 17.

Referring to FIG. 1 and FIG. 4 to FIG. 7, the internal heat sink 4 is provided to a front segment of the internal receiving space 35 of the partitioning bracket 3 and has an internal heat dissipating member 41 and an internal pressure-applying spring 42 which is provided between the internal heat dissipating member 41 and the upper wall 31 of the partitioning bracket 3. The internal heat dissipating member 41 has a base plate 411 and a plurality of heat dissipating fins 412 which are arranged side by side along left-right direction D3, latch with each other and are provided to a top surface of the base plate 411, the base plate 411 has a thermal coupling portion 411*a* which passes through the lower window 321 to enter into the lower receiving space 17, a front end of the thermal coupling portion 411*a* has a guiding edge 411*b*. The internal pressure-applying spring 42 has a pressing plate 421 which presses against a top portion of the internal heat dissipating member 41 and a plurality of plate-shaped spring pieces 422 which extend from the pressing plate 421 and press against the upper wall 31 of the partitioning bracket 3, it is noted that, the internal pressure-applying spring 42 also may be a spring structure in other form and is not limited to the first embodiment. When the pluggable module 200 inserts into the lower receiving space 17, the pluggable module 200 can raise the internal heat dissipating member 41 by means of the guiding edge 411*b* so that the pluggable module 200 contacts the thermal coupling portion 411*a*, at the same time the raised internal heat dissipating member 41 compresses the pressure-applying spring 42 so that the pressure-applying spring 42 provides an elastic acting force. By the elastic force applied by the internal pressure-applying spring 42 on the internal heat dissipating member 41, the internal heat dissipating member 41 can be moved relative to the partitioning bracket 3 along the up-down direction D2, and the thermal coupling portion 411*a* of the internal heat dissipating member 41 is applied with the elastic force and contacts the pluggable module 200, so as to assure contact completeness and strengthen heat dissipating performance.

Referring to FIG. 1 and FIG. 3 to FIG. 6, a rear end of the partitioning bracket 3 is positioned in front of a front end of the upper receptacle 211 and a front end of the lower receptacle 212, the movable heat sink 5 is assembled to the rear end of the partitioning bracket 3 and is positioned behind the internal heat sink 4. Detailedly, in the first embodiment, the partitioning bracket 3 limits the movable heat sink 5 to move in the up-down direction D2 and the left-right direction D3, so that the movable heat sink 5 can move relative to the partitioning bracket 3 between a front position where the movable heat sink 5 is positioned in front of the front end of the upper receptacle 211 and the front end of the lower receptacle 212 (see FIG. 3) and a rearward position where the movable heat sink 5 at least partially enters into between the upper receptacle 211 and the lower receptacle 212 (see FIG. 4). Specifically, the partitioning bracket 3 limits the movable heat sink 5 to move in the up-down direction D2 by the upper wall 31 and the lower wall 32 which is formed with the lower window 321, and limits the movable heat sink 5 to move in the left-right direction D3 by the two side walls 34, so that the movable heat sink 5 only can move between the front position and the rearward position along the front-rear direction D1. In an assembling manner of the first embodiment, firstly the receptacle connector 2 is mounted to the circuit board, then the guiding shield cage 1 which is provided with the partitioning bracket 3 and the movable heat sink 5 cages the receptacle connector 2 from up to down and is fixed to the circuit board, so when the movable heat sink 5 is positioned in the front position where the movable heat sink 5 is in front of the front end of the upper receptacle 211 and the front end of the lower receptacle 212, the movable heat sink 5 can avoid the upper receptacle 211 of the receptacle connector 2 to avoid the movable heat sink 5 and the upper receptacle 211 of the receptacle connector 2 generating interference problem to affect assembling. And, after the assembling is completed, the movable heat sink 5 may be again moved rearwardly to the rearward position where the movable heat sink 5 enters into between the upper receptacle 211 and the lower receptacle 212, so that the partitioning bracket 3 together with the movable heat sink 5 play complete partitioning function. Generally, by the movable heat sink 5 which can move between the front position and the rearward position, in a precondition that the partitioning bracket 3 together with the movable heat sink 5 subsequently can play complete partitioning function, the interference problem generated between the movable heat sink 5 and the receptacle connector 2 in assembling process can be avoided, which is beneficial to assembling operation. Importantly, by means of the internal heat sink 4 and the movable heat sink 5 which is positioned in the rearward position, a distance between the internal heat sink 4 and the movable heat sink 5 can be lengthened, and a range where heat dissipating is performed on the pluggable module 200 can be enlarged, in turn heat dissipating efficacy is promoted.

The movable heat sink 5 includes a movable heat dissipating member 51 and a movable pressure-applying spring. The movable pressure-applying spring includes a movable supporting frame 52 and a plurality of movable pressure-applying elastic pieces 53. The movable heat dissipating member 51 is assembled in the movable supporting frame 52, the movable heat dissipating member 51 includes a base 511 and a plurality of heat dissipating fins 512. The base 511 has a lower wall 511*a* and two side assembling plates 511*b* which are integrally constructed to extend upwardly from a left side and a right side edge of the lower wall 511*a* respectively, the lower wall 511*a* of the base 511 has a thermal coupling portion 511*c* which downwardly enters into the lower receiving space 17 via the lower window 321, a front end of the thermal coupling portion 511*c* has a guiding edge 511*g*, the plurality of heat dissipating fins 512 are arranged side by side along the left-right direction D3, latch with each other and are provided to a top surface of the base 511. The movable supporting frame 52 has an upper wall 521 and two side walls 54 which extend downwardly from the upper wall 521, each side assembling plate 511*b* at each of two sides of the movable heat dissipating member 51 has a latching aperture 511*d*, each side wall 54 has a latching piece 541 which obliquely extends inwardly and rearwardly and is used to latch with the latching aperture 511*d*, a width of the latching aperture 511*d* in the up-down direction D2 is larger than a width of the latching piece 541, by that the two side assembling plates 511*b* at the two sides of the movable heat dissipating member 51 are assembled to the two side walls 54 of the movable supporting frame 52 in a manner that the two side assembling plates 511*b* can float in the up-down direction, the movable heat dissipating member 51 can move in the up-down direction D2 relative to the movable supporting frame 52, on the other hand, the movable supporting frame 52 can limit the movable heat dissipating member 51 to move in the left-right direction D3 by the two side walls 54, the movable supporting frame 52 can limit a distance of the movable heat dissipating member 51 moving in the up-down direction D2 by the upper wall 521 and lower edges of the two side walls 54 which are inwardly bent. The plurality of movable pressure-applying elastic pieces 53 are integrally constructed to be provided to the upper wall 521 of the movable supporting frame 52, and obliquely extend downwardly to apply elastic forces to the plurality of heat dissipating fins 512 of the movable heat dissipating member 51, so that the movable heat dissipating member 51 can elastically move in the up-down direction relative to the movable supporting frame 52 and the partitioning bracket 3. When the pluggable module 200 inserts into the lower receiving space 17, the pluggable module 200 can raise the movable heat dissipating member 51 by means of the guiding edge 511*g*, so that the pluggable module 200 contacts the thermal coupling portion 511*c*, at the same time the raised movable heat dissipating member 51 compresses the plurality of movable pressure-applying elastic pieces 53 so that the plurality of movable pressure-applying elastic pieces 53 provide elastic acting forces. With the elastic forces applied to the movable heat dissipating member 51 by the plurality of movable pressure-applying elastic pieces 53, the movable heat dissipating member 51 can be moved along the up-down direction D2 relative to the movable supporting frame 52, and the thermal coupling portion 511*c* of the movable heat dissipating member 51 is applied with the elastic forces and contacts the pluggable module 200, so as to assure contact completeness and strengthen heat dissipating performance. The two side walls 54 of the movable supporting frame 52 are constructed as the two side walls 54 of the movable heat sink 5.

The two side walls 12 of the guiding shield cage 1 have holding members 126, the two side walls 54 of the movable heat sink 5 have first holding portions 542 which latch with the holding members 126 respectively when the movable heat sink 5 is in the front position and second holding portions 543 which latch with the holding members 126 respectively when the movable heat sink 5 is in the rearward position. Specifically, the holding members 126 in the first embodiment are two elastic holding pieces which are respectively constructed on the two side walls 12 of the guiding shield cage 1 and extend inwardly. The first holding portions 542 of the movable heat sink 5 are limiting holes which are constructed on the two side walls 54 of the movable heat sink 5 respectively, the second holding portions 543 of the movable heat sink 5 are front edges which are constructed on the two side walls 54 of the movable heat sink 5 respectively.

In addition, each side wall 54 and each side assembling plate 511*b* of the movable heat sink 5 further respectively have limiting grooves 544, 511*e*, each side wall 12 of the guiding shield cage 1 further has a limiting piece 127 which is positioned behind the corresponding holding member 126 and inwardly extends to correspondingly enter into the limiting grooves 544, 511*e*, each side wall 34 of the partitioning bracket 3 has two avoiding openings 341 which respectively allow the holding member 126 (the elastic holding piece) and the limiting piece 127 to pass through. In a varied embodiment, the holding member 126 (the elastic holding piece) and the limiting piece 127 may be constructed on each side wall 34 of the partitioning bracket 3. A rear end of each side wall 54 of the movable heat sink 5 has a guiding member 545 which extends outwardly and bends upwardly and is sheet-shaped, each side wall 34 of the partitioning bracket 3 has a guiding member receiving notch 342 which is positioned to the rear end of each side wall 34 of the partitioning bracket 3 and is used to receive a part of the guiding member 545 which extends outwardly, each side wall 12 of the guiding shield cage 1 has a guiding rail groove 128, the part of the guiding member 545 which extends outwardly is provided to the guiding rail groove 128 so as to be capable of sliding forwardly or rearwardly, in addition, a front segment of the guiding rail groove 128 has a hole which is larger, so the part of the guiding member 545 which bends upwardly can correspondingly passes through the hole in an assembling process of the movable heat sink 5, the partitioning bracket 3 and the guiding shield cage 1. It is noted that, in other embodiments, the guiding members 545 also may be provided to the two side walls 12 of the guiding shield cage 1 respectively, the guiding rail grooves 128 also may be provided to the two side walls 54 of the movable heat sink 5 respectively.

Specifically, referring to FIG. 3, FIG. 6 and FIG. 8 to FIG. 9, when the movable heat sink 5 is in the front position, the movable heat sink 5 is substantially received in a rear segment of the internal receiving space 35 of the partitioning bracket 3, the elastic holding piece (the holding member 126) latches with the limiting hole (the first holding portion 542), the limiting piece 127 is positioned to a rear end of the limiting groove 544 and a rear end of the limiting groove 511*e*, the guiding member 545 is received in the guiding member receiving notch 342 and is positioned to a front end of the guiding rail groove 128; referring to FIG. 4, FIG. 6 and FIG. 10 to FIG. 11, when the movable heat sink 5 is moved to the rearward position from the front position, a front segment part of the movable heat sink 5 is received in the rear segment of the internal receiving space 35 of the partitioning bracket 3, a rear segment part of the movable heat sink 5 is rearwardly exposed from the internal receiving space 35 of the partitioning bracket 3, and enters into between the upper receptacle 211 and the lower receptacle 212, the elastic holding piece (the holding members 126) latches with the front edge (the second holding portion 543) of the two side walls 54 of the movable heat sink 5, the limiting piece 127 is positioned to a front end of the limiting groove 544 and a front end of the limiting groove 511*e*, the guiding member 545 leaves the guiding member receiving notch 342 and moves to a rear end of the guiding rail groove 128. By the corresponding latching cooperation between the holding member 126 and the first holding portion 542 and the corresponding latching cooperation between the holding member 126 and the second holding portion 543, the movable heat sink 5 can be positioned in the front position and the rearward position respectively, and by the corresponding cooperation between the limiting piece 127 and the limiting grooves 544,511e and the corresponding cooperation between the guiding member 545 and the guiding rail groove 128, the movable heat sink 5 can be subjected to sufficient guiding, limiting and supporting.

Figure 6:
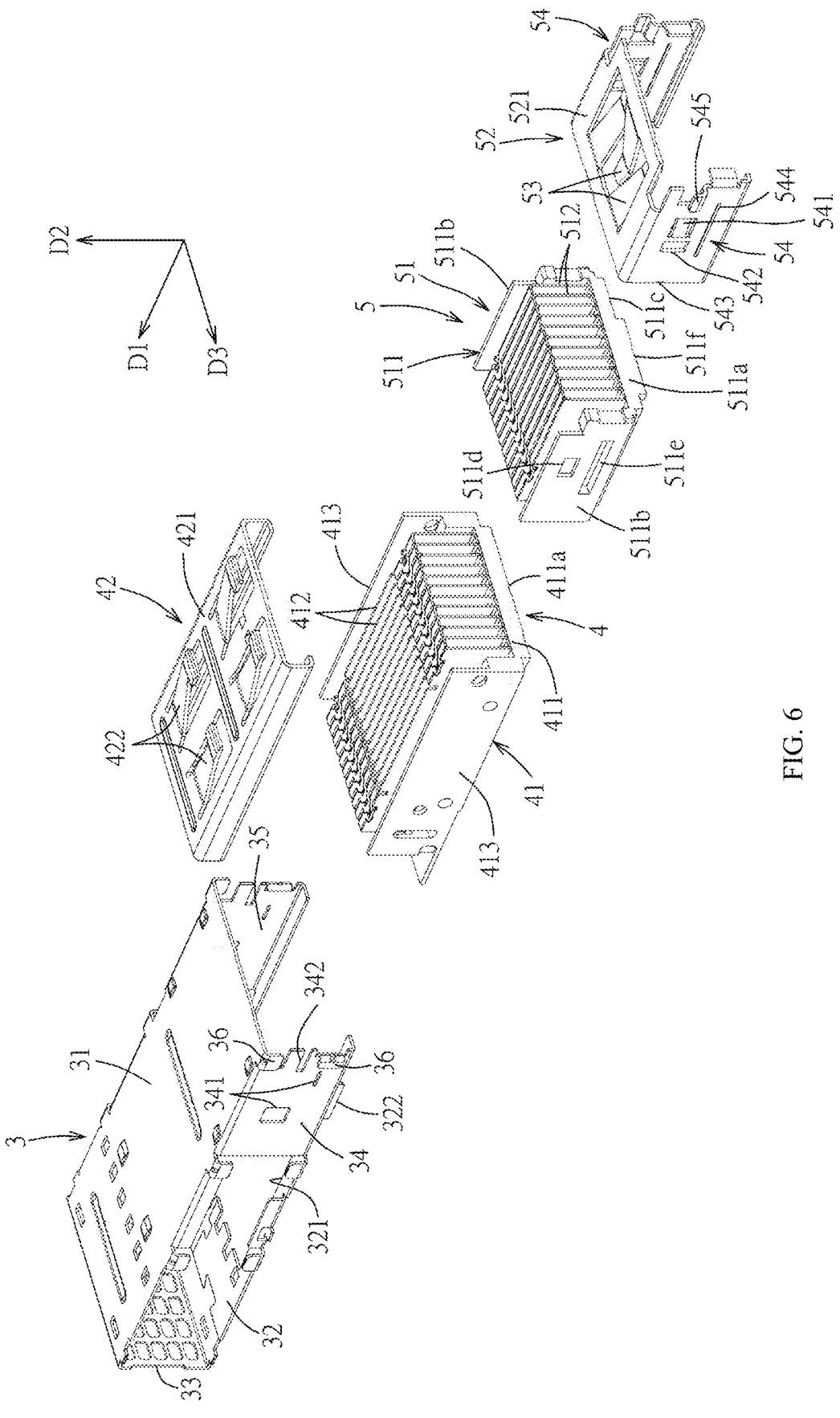
FIG. 6 is a perspective exploded view of the partitioning bracket, the internal heat sink and the movable heat sink of the first embodiment.
Figure 7:
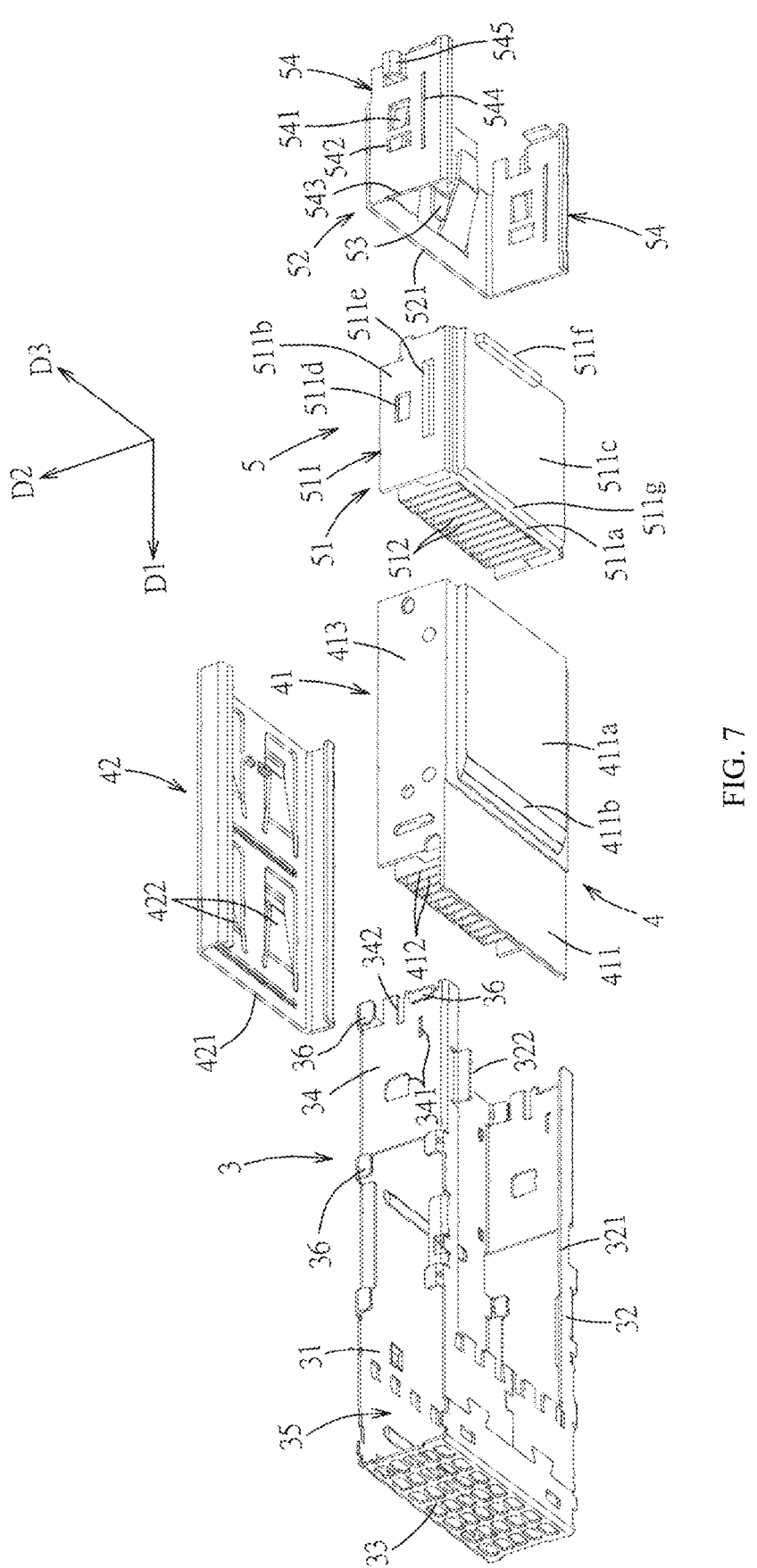
FIG. 7 is a perspective exploded view of the partitioning bracket, the internal heat sink and the movable heat sink of the first embodiment viewed from another angle.
Figure 8:
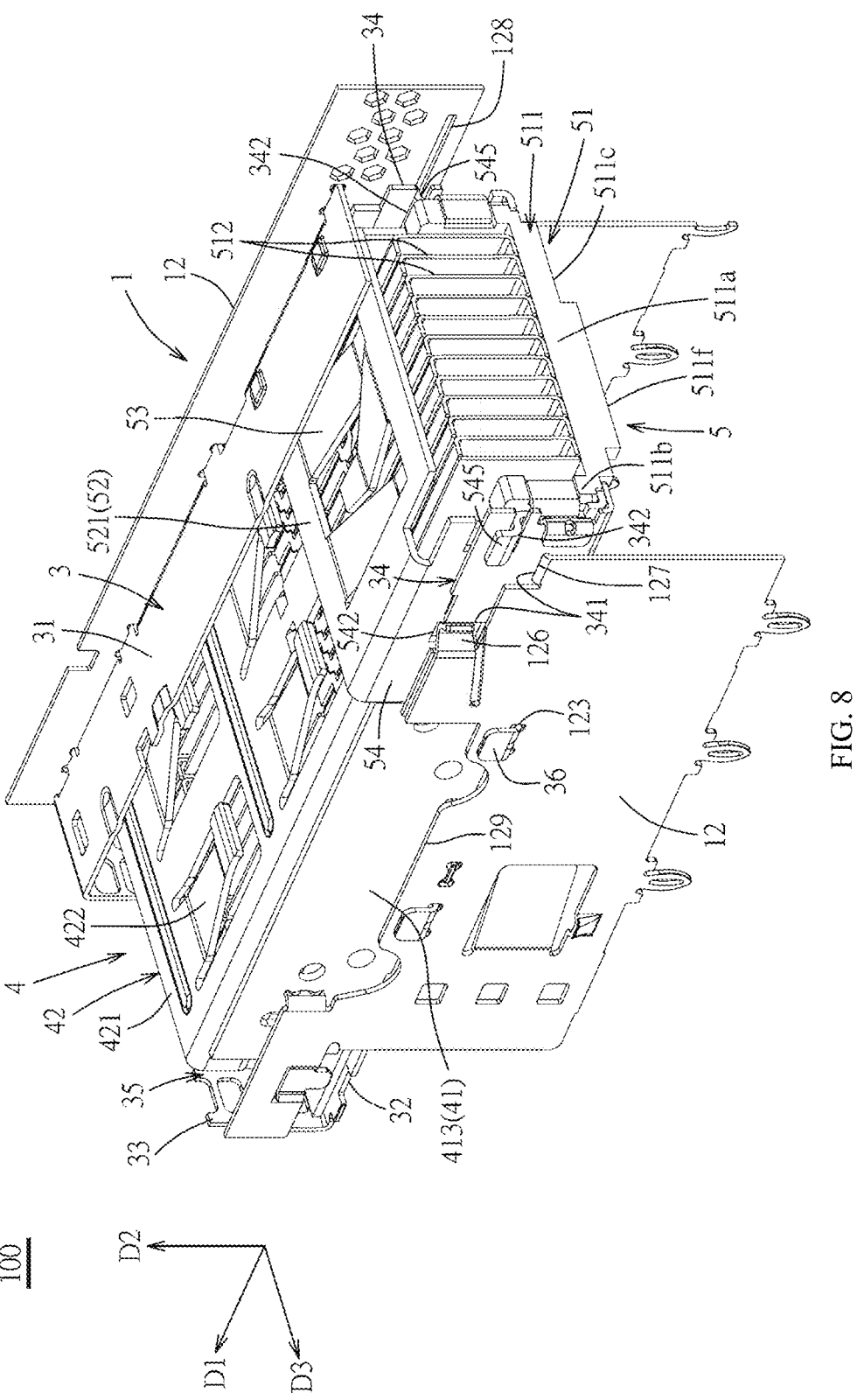
FIG. 8 is a partial perspective view of the first embodiment with the movable heat sink being in the front position.
Figure 9:
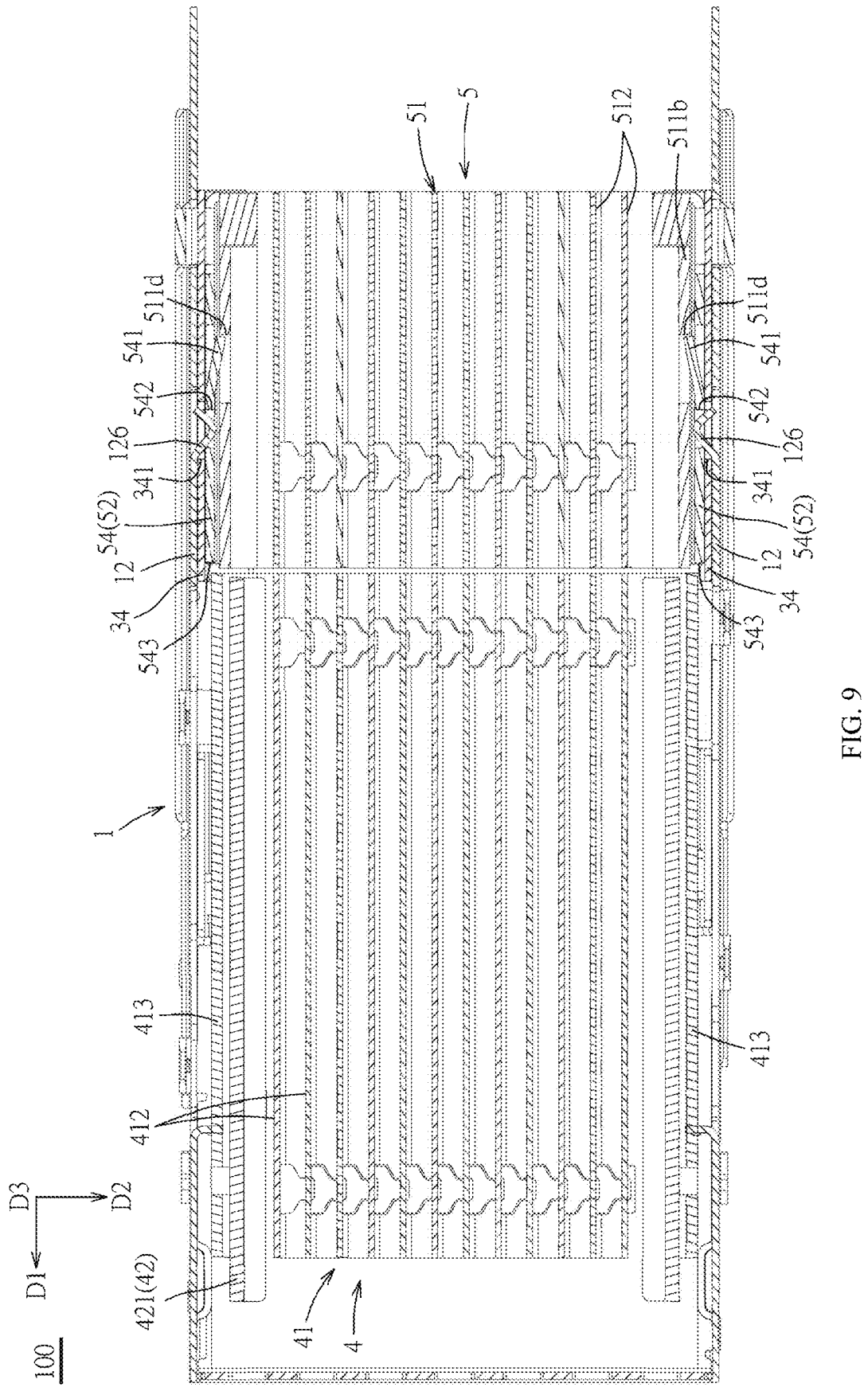
FIG. 9 is the first embodiment of a cross sectional view with movable heat sink being in the front position.
Figure 10:
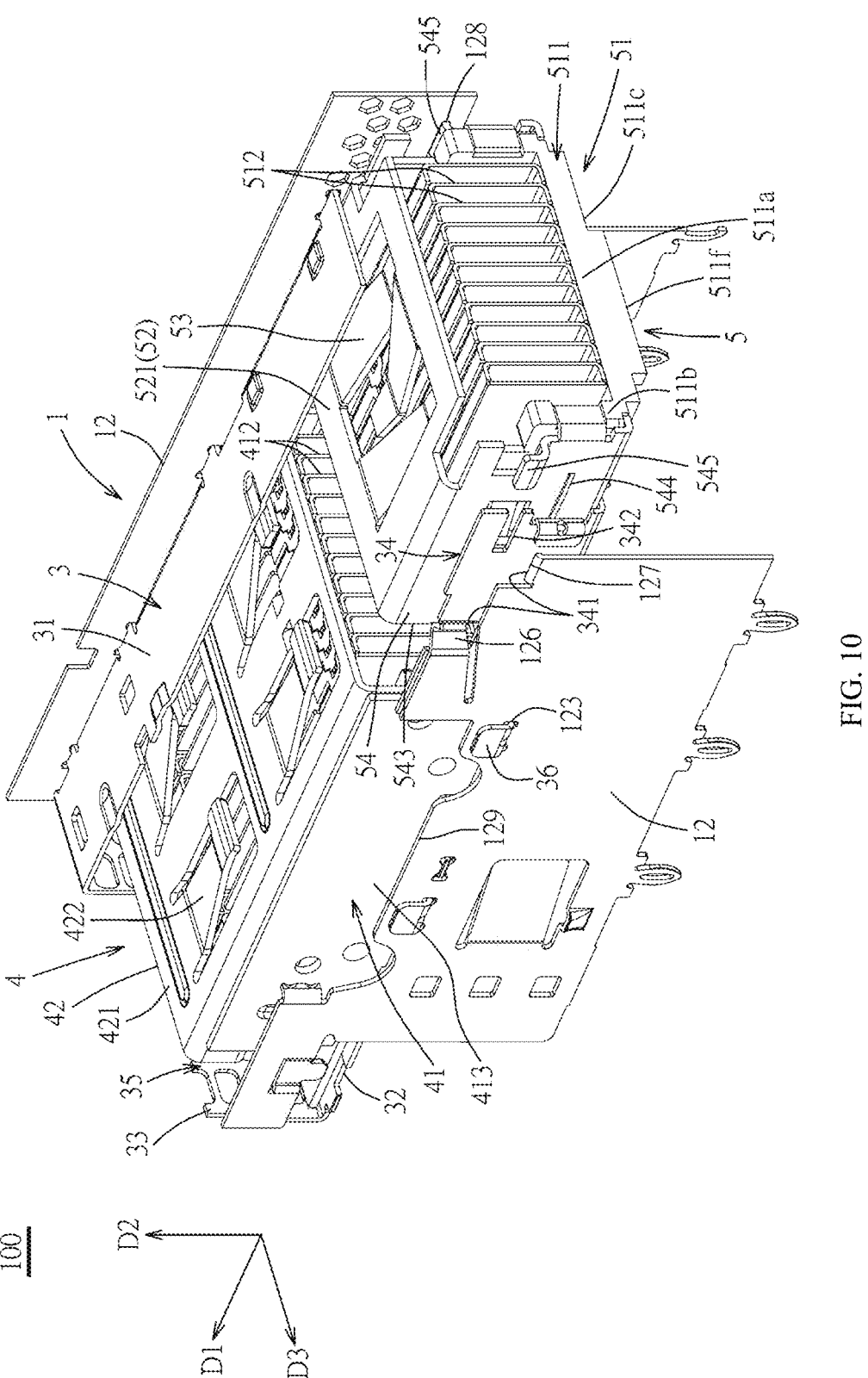
FIG. 10 is a partial perspective view of the first embodiment with movable heat sink being in the rearward position.
Figure 11:
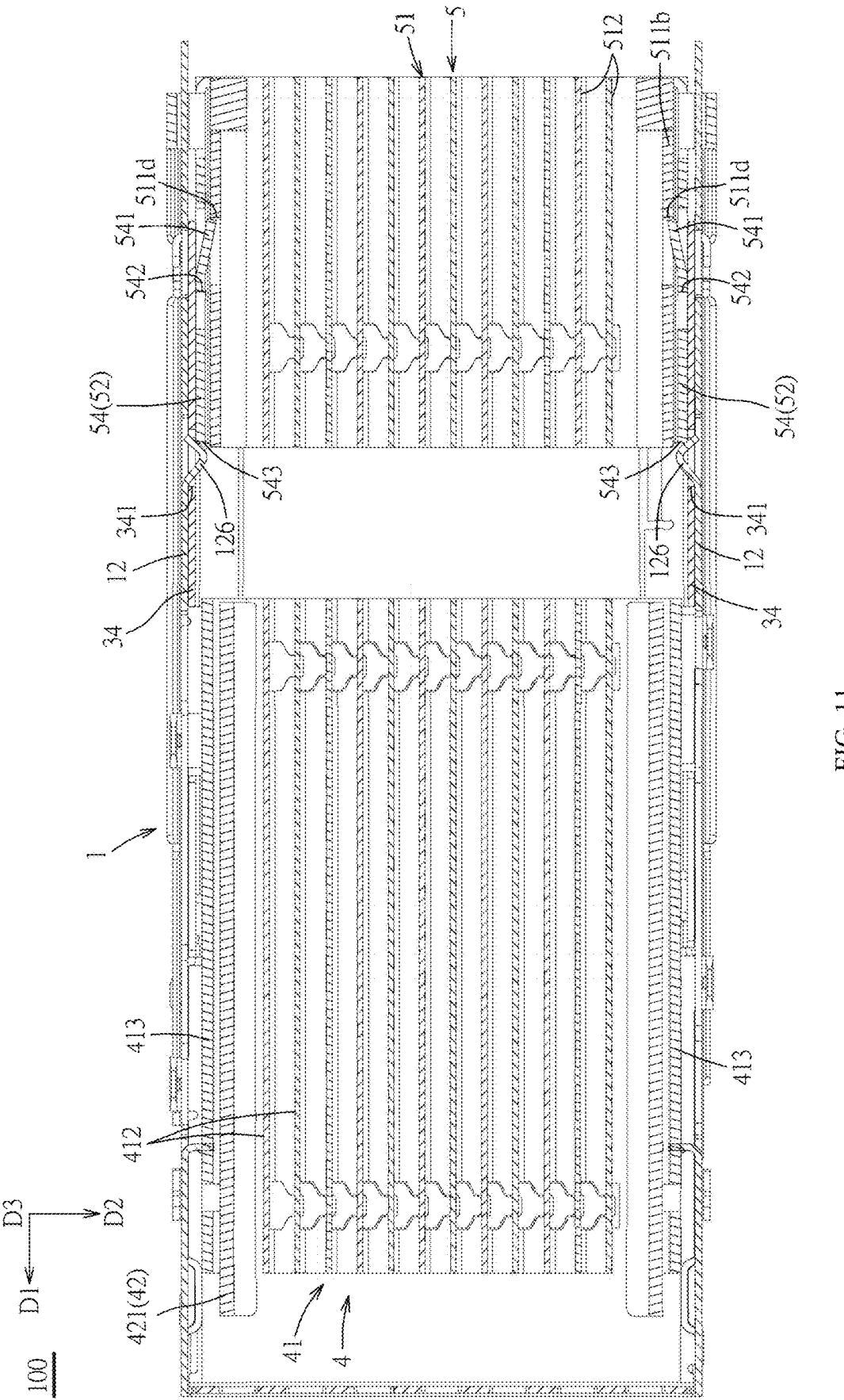
FIG. 11 is the first embodiment of a cross sectional view with the movable heat sink being in the rearward position.
Figure 12:
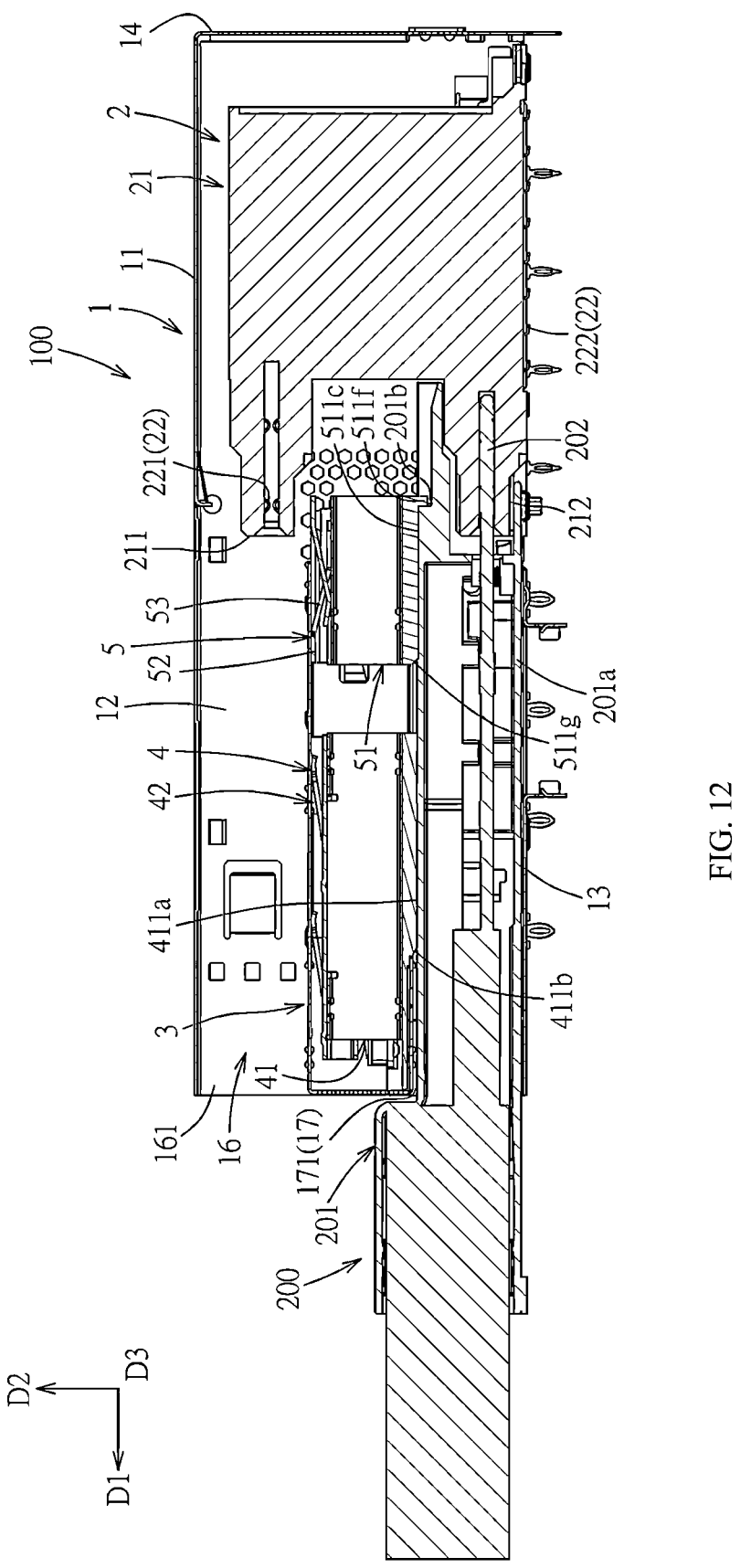
FIG. 12 is a cross sectional view similar to FIG. 4 with the pluggable module pushing the movable heat sink to the rearward position.

Referring to FIG. 6, FIG. 7 and FIG. 12, in addition, in the first embodiment, the lower wall 32 of the partitioning bracket 3 is further formed with an aligning portion 322 which bends downwardly from a side edge of the lower window 321, protrudes to enter into the lower receiving space 17 and is used to align with and guide an aligning groove 201d (see FIG. 1) of the pluggable module 200, a rear end edge of the thermal coupling portion 511c of the movable heat sink 5 of the movable heat dissipating member 51 has a lower stopping portion 511f which downwardly enters into the lower receiving space 17 and is used to stop the aligning structure 201c of the pluggable module 200 so as to limit the inserting position of the pluggable module 200, when the movable heat sink 5 is in the front position, the pluggable module 200 which enters into the lower receiving space 17 can push the lower stopping portion 511f to make the movable heat sink 5 rearwardly move to the rearward position, by this, the pluggable module 200 which enters into the lower receiving space 17 at a first time can employ the lower stopping portion 511f to push the movable heat sink 5 rearwardly to the rearward position while the pluggable module 200 enters into the lower receiving space 17 at the first time, which omits a manual operation step in assembling.

Referring to FIG. 1, FIG. 2, FIG. 6 and FIG. 8, a left side edge and a right side edge of the base plate 411 of the internal heat dissipating member 41 which is positioned in the internal receiving space 35 of the partitioning bracket 3 are integrally constructed and formed with two side plates 413 which extend upwardly, each side wall 12 of the guiding shield cage 1 has a side wall opening 129 which is communicated with the internal receiving space 35 of the partitioning bracket 3, the two side heat sinks 6 are provided to the two side plates 413 respectively from outer sides of the two side walls 12 of the guiding shield cage 1 by means of the two side wall openings 129, each side heat sink 6 includes a side heat dissipating member 61 and two screwing member 62 which fix the side heat dissipating member 61 to two screwing holes of the corresponding side plate 413, the two side heat sinks 6 can synergize with the internal heat dissipating member 41 of the internal heat sink 4 for heat dissipating, so as to enhance heat dissipating efficiency.

Referring to FIG. 1 to FIG. 3, the upper heat sink 7 includes an upper heat dissipating member 71 and two elastic clips 72. The upper heat dissipating member 71 is provided at the upper window 111 of the top wall 11 of the guiding shield cage 1, the upper heat dissipating member 71 has a base plate 711 which is provided to the top wall 11, a plurality of heat dissipating fins 712 which are arranged side by side along the left-right direction D3, latch with each other and are provided to a top surface of the base plate 711, and a thermal coupling portion (not shown) which is provided to a bottom surface of the base plate 711 and enters into the upper receiving space 16 via the upper window 111. The upper heat dissipating member 71 is assembled to the top wall 11 of the guiding shield cage 1 by the two elastic clips 72 in a manner that the upper heat dissipating member 71 can elastically move relative to the upper receiving space 16 and the thermal coupling portion of the upper heat dissipating member 71 elastically contacts the pluggable module 200 which inserts into the upper receiving space 16. Each elastic clip 72 has an elastic pressing portion 721 which extends along the left-right direction D3 and presses against the base plate 711 of the upper heat dissipating member 71 from above and two assembling portions 722 which respectively extend downwardly from two ends of the elastic pressing portion 721 and respectively latch with the two side walls 12 of the guiding shield cage 1, specifically, each side wall 12 which is positioned at each of the two sides of the top wall 11 is formed with two latching protrusions 1210, each assembling portion 722 is formed with a latching hole 722a which correspondingly latches with the latching protrusion 1210 of the corresponding side wall 12. In addition, the upper heat dissipating member 71 further has two avoiding recessed grooves 714 which are formed to the plurality of heat dissipating fins 712 and are used to avoid the two elastic pressing portions 721 respectively.

The bottom wall 13 of the guiding shield cage 1 is formed with a lower opening 133 which is communicated with the lower receiving space 17 and two latching plates 134 which are provided at a front end and a rear end of the lower opening 133 respectively and extend downwardly, the two latching plates 134 may be integrally constructed by the bottom wall 13, each latching plate 134 has a latching protuberance 134a which is integrally constructed and inwardly formed and two latching lugs 134b which are integrally constructed to be respectively formed at two side edges of the latching protuberance 134a. The lower heat dissipating member 8 has a base plate 81, a plurality of heat dissipating fins 82 which are arranged side by side along the left-right direction D3, latch with each other and are provided to the base plate 81, and a thermal coupling portion 83 which is provided to a top surface of the base plate 81 and is used to pass through the lower opening 133 to enter into the lower receiving space 17, the thermal coupling portion 83 of the lower heat dissipating member 8 is used to contact the pluggable module 200 which inserts into the lower receiving space 17. A front side edge and a rear side edge of the base plate 81 of the lower heat dissipating member 8 are formed with two latching recessed grooves 811 which are respectively assembled to the two latching plates 134 and extend along the left-right direction D3. The two latching protuberances 134a of the two latching plates 134 respectively latch with the two latching recessed grooves 811, the two latching lugs 134b may be bent to enter into the corresponding latching recessed groove 811, so the heat dissipating member 8 is stably assembled to the two latching plates 134 of the bottom wall 13.

Figure 13:
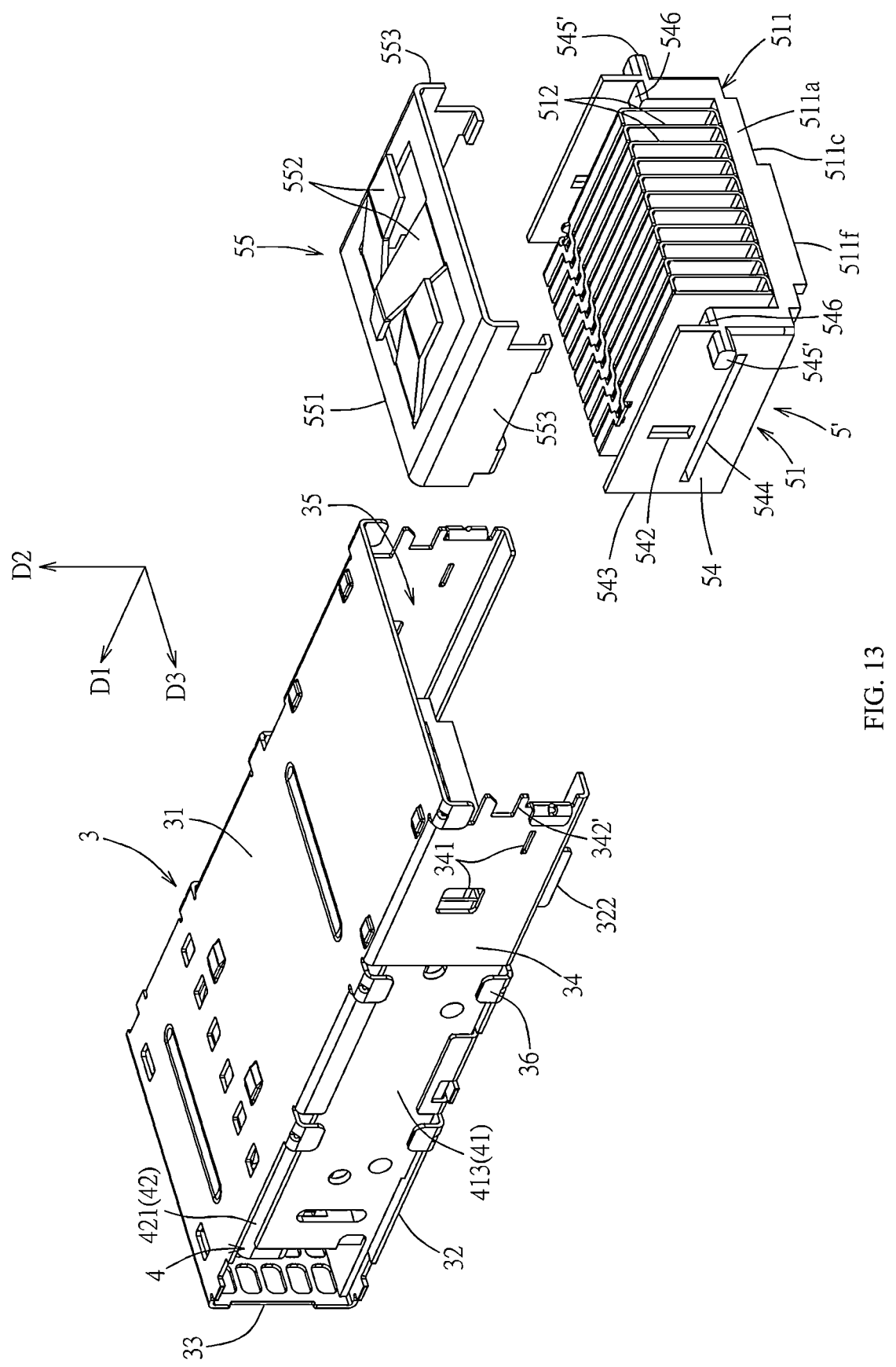
FIG. 13 is a perspective exploded view of a guiding shield cage, a partitioning bracket, an internal heat sink and a movable heat sink of a second embodiment of the connector assembly of the present disclosure.
Figure 14:
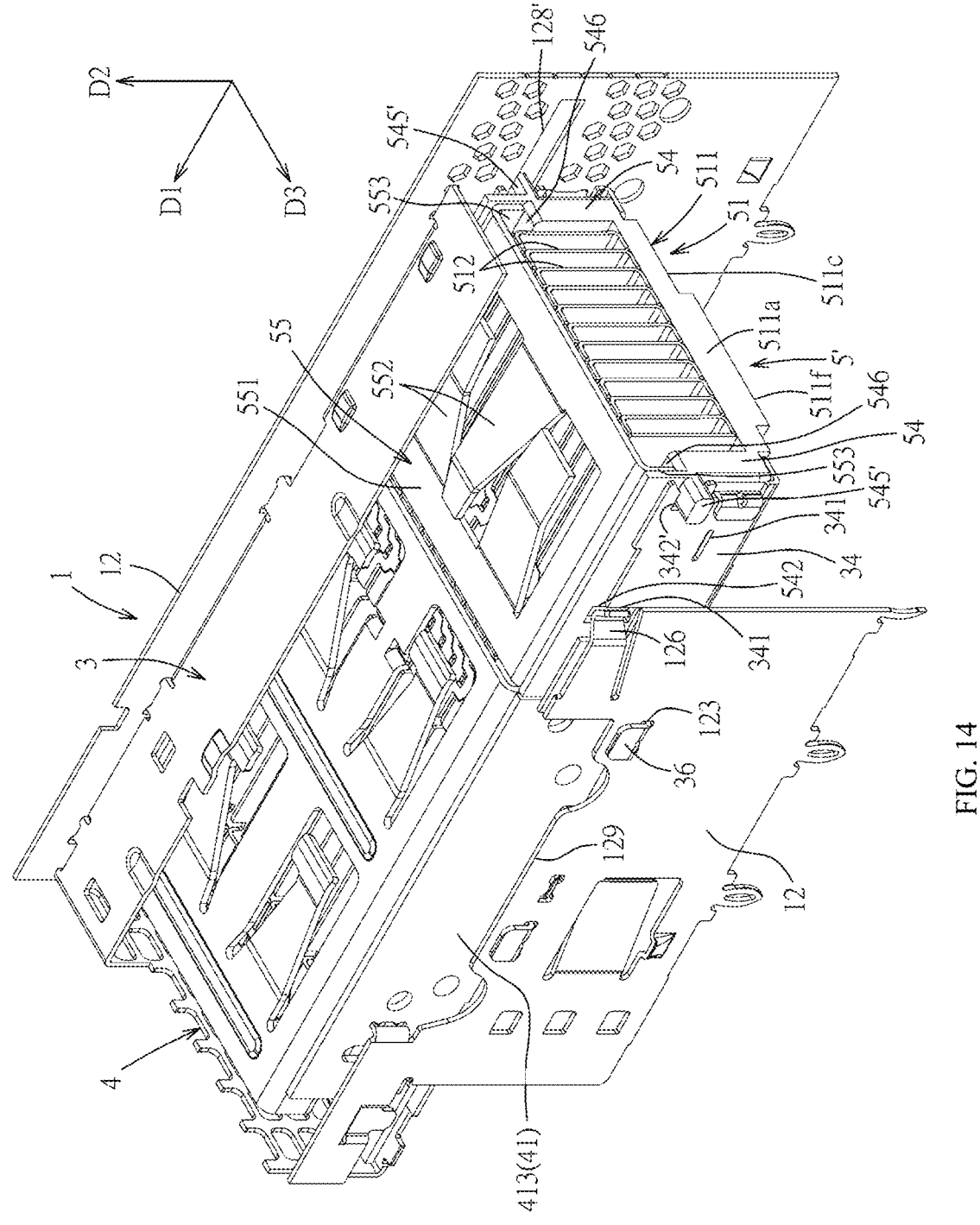
FIG. 14 is a partial perspective view of the second embodiment with the movable heat sink being in the front position.
Figure 15:
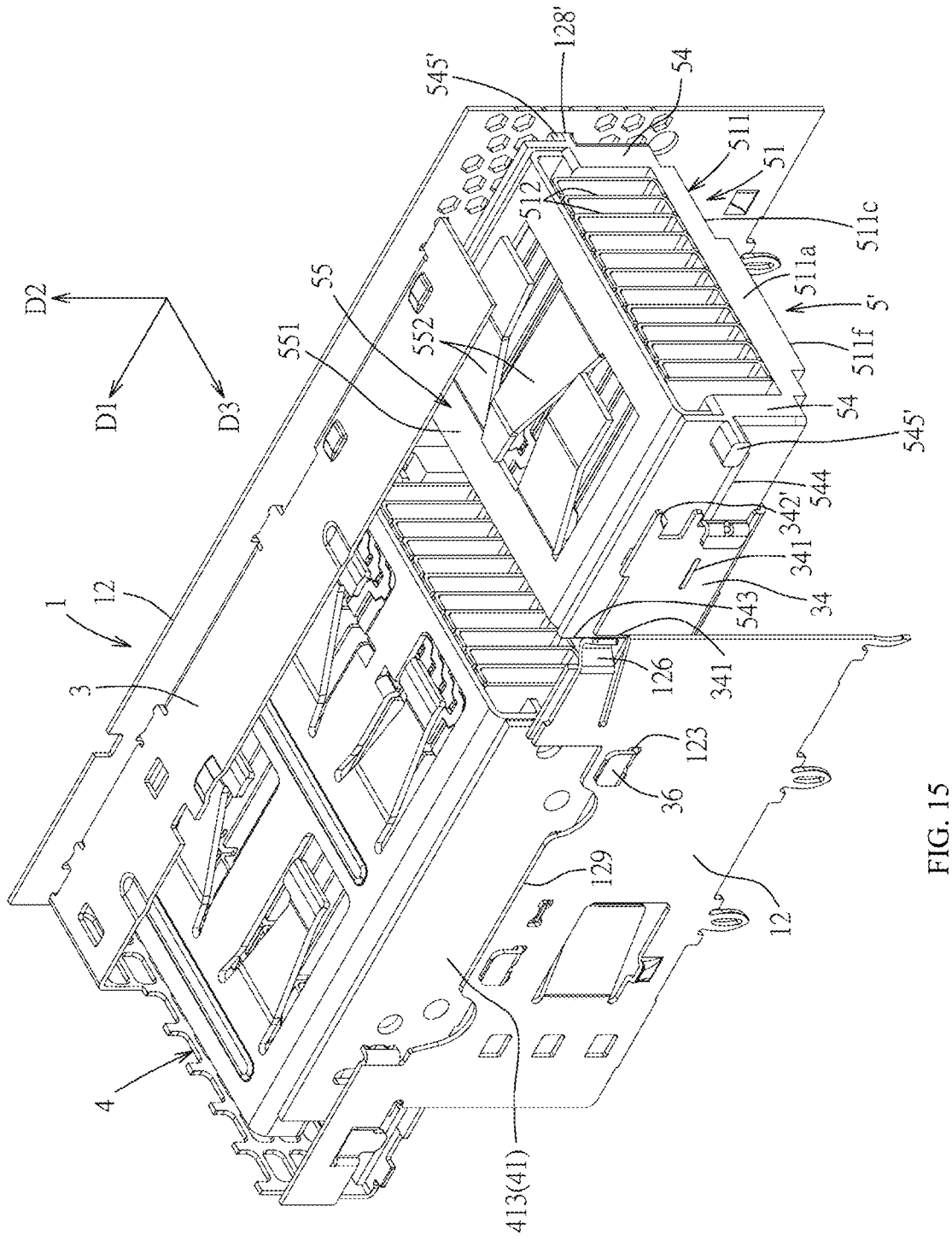
FIG. 15 is a partial perspective view of the second embodiment with the movable heat sink being in the rearward position.

Referring to FIG. 13 to FIG. 15, a second embodiment of the connector assembly 100 of the present disclosure differs from the first embodiment in that, the movable heat sink 5' includes a movable heat dissipating member 51 and a movable pressure-applying spring 55. The movable heat dissipating member 51 has a base 511 and a plurality of heat dissipating fins 512. The base 511 has a lower wall 511a and two side walls 54 which are integrally constructed from a left side edge and a right side edge of the lower wall 511a respectively and extends upwardly, the lower wall 511a of the base 511 has a thermal coupling portion 511c which downwardly enters into the lower receiving space 17. The plurality of heat dissipating fins 512 are arranged side by side along the left-right direction D3, latch with each other and are provided to a top surface of the lower wall 511*a*. The movable pressure-applying spring 55 has a pressing plate 551 which presses against the movable heat dissipating member 51 and two side plates 553 which extend downwardly from a left side edge and a right side edge of the pressing plate 551 respectively, lower edges of the two side plates 553 of the movable pressure-applying spring 55 of the second embodiment are respectively positioned at inner sides of the two side walls 54 and respectively press against step portions 546 which are respectively positioned at the inner sides of the two side walls 54, the pressing plate 551 has a plurality of plate-shaped spring pieces 552 which press against the upper wall 31 of the partitioning bracket 3, it is noted that, the movable pressure-applying spring 55 also may be a spring structure in other form and is not limited to the second embodiment. The movable pressure-applying spring 55 is positioned between the movable heat dissipating member 51 and the upper wall 31 of the partitioning bracket 3, and applies an elastic force to the movable heat dissipating member 51, so that the movable heat dissipating member 51 can be elastically upwardly or downwardly moved relative to the partitioning bracket 3 along the up-down direction D2, and the thermal coupling portion 551*c* of the movable heat dissipating member 51 is applied with the elastic force and contacts the pluggable module 200 which inserts into the lower receiving space 17, so as to assure contact completeness and strengthen heat dissipating performance.

The two side walls 54 of the base 511 are constructed as the two side walls 54 of the movable heat sink 5', and each side wall 54 is formed with the first holding portion 542 (the limiting hole), the second holding portion 543 (the front edge of the side wall 54 of the movable heat sink 5'), the limiting groove 544 and the guiding member 545'. In addition, the guiding member 545' in the second embodiment is not sheet-shaped but is block-shaped and extends outwardly along the left-right direction D3, so a width of the guiding rail groove 128', which correspondingly cooperates with the guiding member 545', of the side wall 12 of the guiding shield cage 1 in the up-down direction D2 and a width of the guiding member receiving notch 342', which correspondingly cooperates with the guiding member 545', of the partitioning bracket 3 in the up-down direction D2 are also correspondingly larger than the first embodiment.

Referring to FIG. 16 to FIG. 20, a third embodiment of the connector assembly 100 of the present disclosure differs from the second embodiment in that, in the third embodiment, the internal heat sink 4 is omitted, the movable heat dissipating member 51 of the movable heat sink 5" is provided in the internal receiving space 35 of the partitioning bracket 3, a length of the movable heat dissipating member 51 of the movable heat sink 5" of the third embodiment in the front-rear direction D1 is longer, and similarly can move between the front position where the movable heat sink 5" is positioned in front of the front end of the upper receptacle 211 and the front end of the lower receptacle 212 and the rearward position where the movable heat sink 5" at least partially enters into between the upper receptacle 211 and the lower receptacle 212.

In the third embodiment, lower edges of the two side pressing portions 554 of the movable pressure-applying spring 55 press against inner sides of the two side walls 54 of the movable heat dissipating member 51 of the movable heat sink 5", and each side pressing portion 554 has a positioning groove 554*a* which is recessed upwardly, each side wall 54 of the movable heat dissipating member 51 of the movable heat sink 5" has a positioning block 547 which is positioned to the inner side of each side wall 54 and upwardly snaps into the positioning groove 554*a*. By that the positioning groove 554*a* and the positioning block 547 cooperate with each other, the movable pressure-applying spring 55 is assembled to the movable heat dissipating member 51 of the movable heat sink 5" and moves together with the movable heat dissipating member 51.

The pressing plate 551 of the movable pressure-applying spring 55 similarly has a plurality of plate-shaped spring pieces 552 which press against the upper wall 31 of the partitioning bracket 3. The movable pressure-applying spring 55 is positioned between the movable heat dissipating member 51 and the upper wall 31 of the partitioning bracket 3, and applies an elastic force to the movable heat dissipating member 51, so that the movable heat dissipating member 51 of the movable heat sink 5" can be elastically moved upwardly or downwardly along the up-down direction D2 relative to the partitioning bracket 3, and the thermal coupling portion 551*c* of the movable heat dissipating member 51 is applied with the elastic force and contacts the pluggable module 200 (see FIG. 1) which inserts into the lower receiving space 17, so as to assure contact completeness and strengthen heat dissipating performance.

Figure 18:
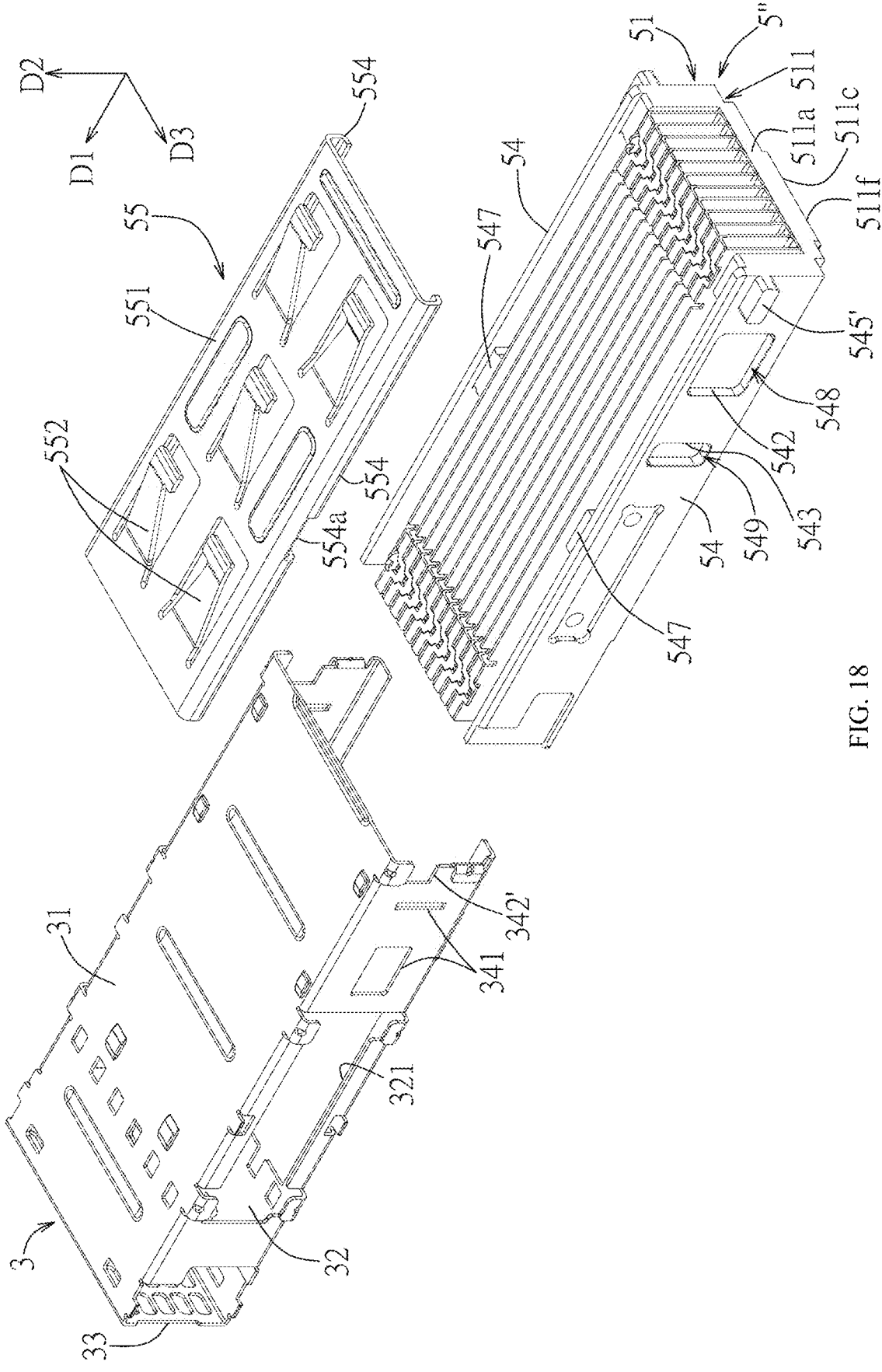
FIG. 18 is a perspective exploded view of a partitioning bracket and a movable heat sink of the third embodiment.
Figure 19:
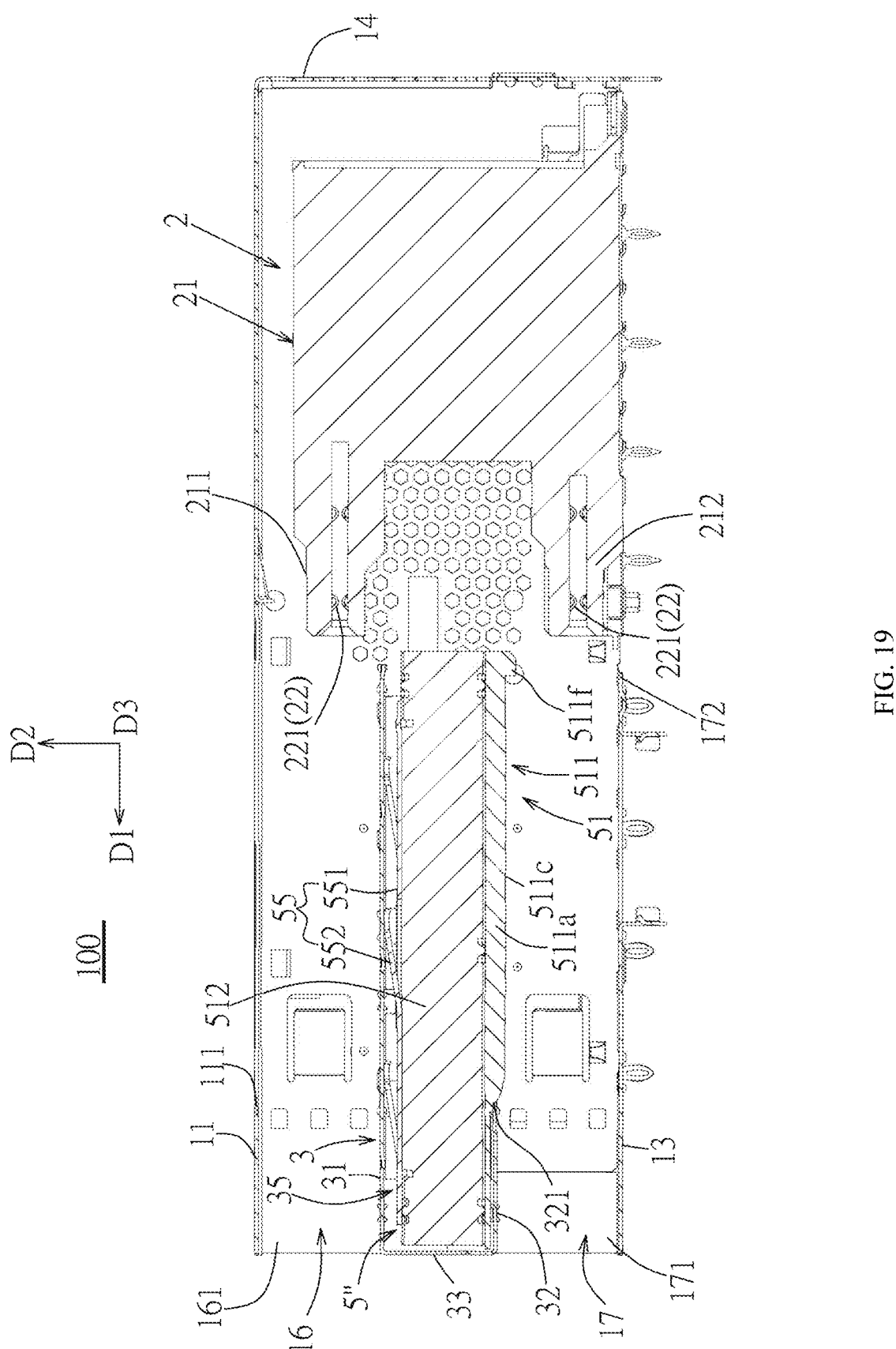
FIG. 19 is a cross sectional view of the third embodiment with the upper heat sink and the lower heat dissipating member omitted and the movable heat sink positioned in a front position.
Figure 20:
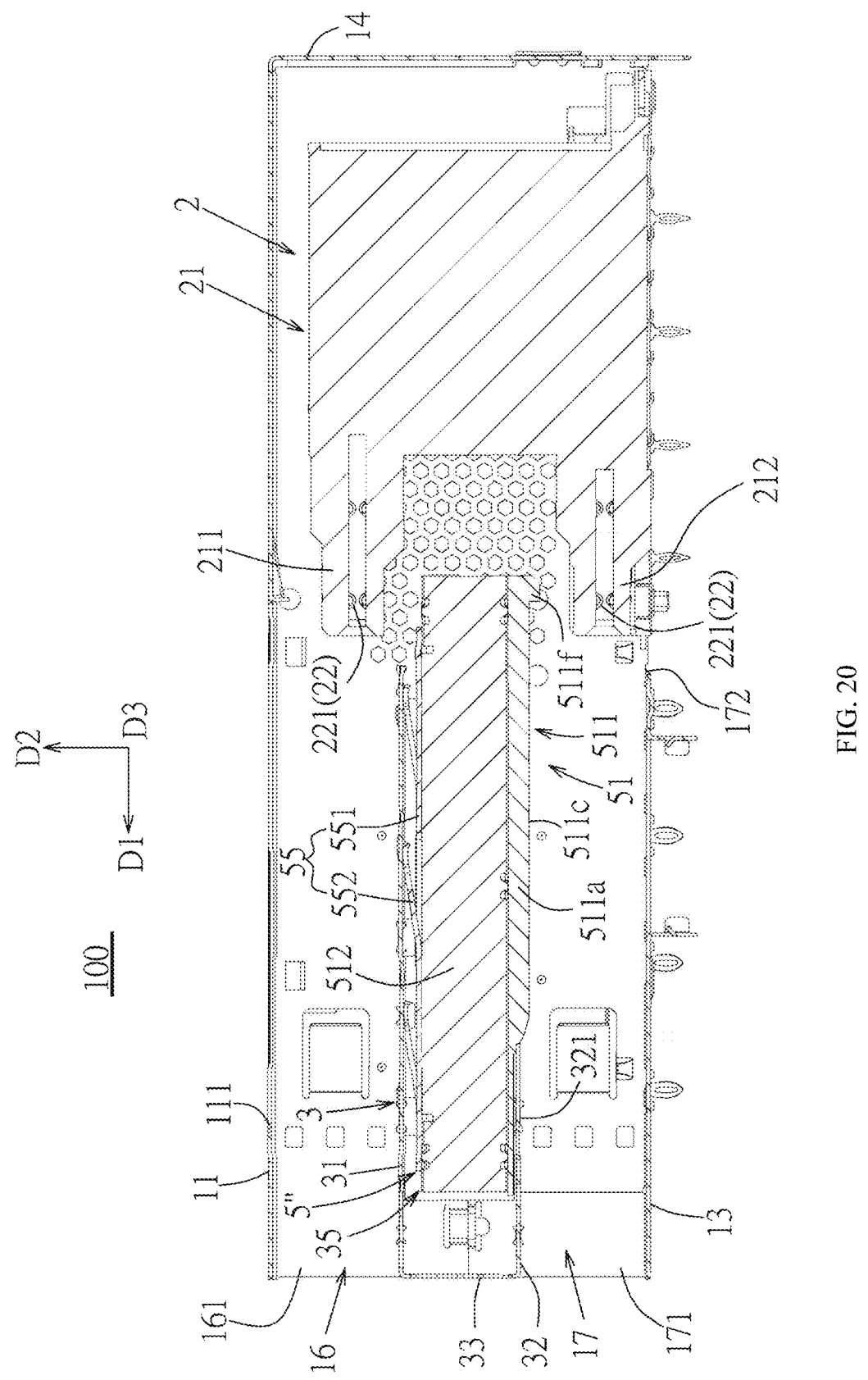
FIG. 20 is a cross sectional view of the third embodiment with the upper heat sink and the lower heat dissipating member omitted and the movable heat sink positioned in a rearward position.
Figure 21:
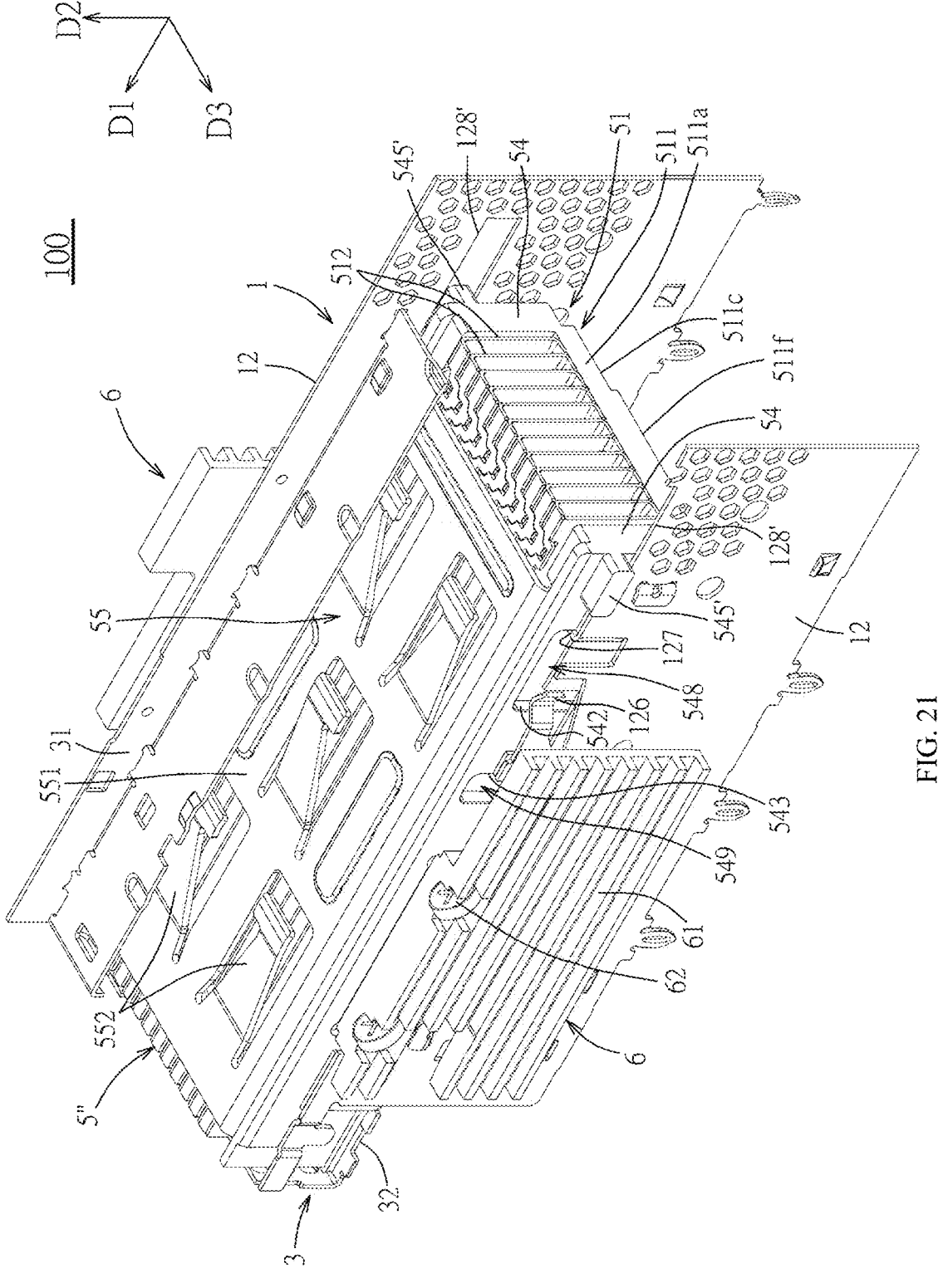
FIG. 21 is a partial perspective view of the third embodiment with the movable heat sink being in the front position.
Figure 22:
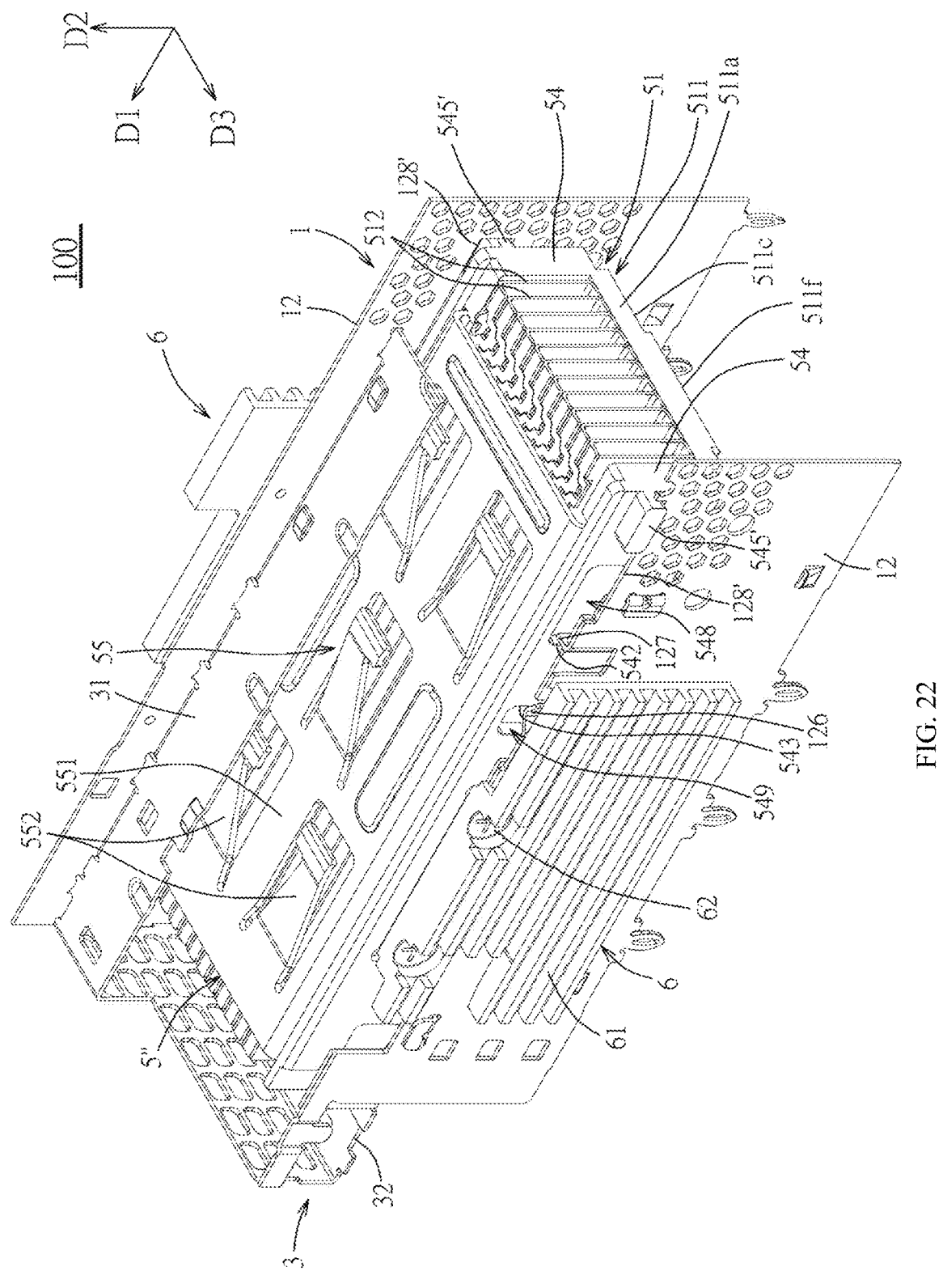
FIG. 22 is a partial perspective view of the third embodiment with the movable heat sink being in the rearward position.

Referring to FIG. 18, FIG. 21 and FIG. 22, in addition, in the third embodiment, the two side walls 54 of the base 511 are constructed as the two side walls 54 of the movable heat sink 5", and each side wall 54 is formed with a first recessed groove 548 and a second recessed groove 549 which is positioned in front of the first recessed groove. The first holding portions 542 are front ends of the first recessed grooves 548 constructed on the two side walls 54 of the movable heat sink 5", the second holding portions 543 are rear ends of the second recessed grooves 549 constructed on the two side walls 54 of the movable heat sink 5". The limiting pieces 127 of the two side walls 12 of the guiding shield cage 1 enter into the first recessed grooves 548 respectively.

Figure 23:
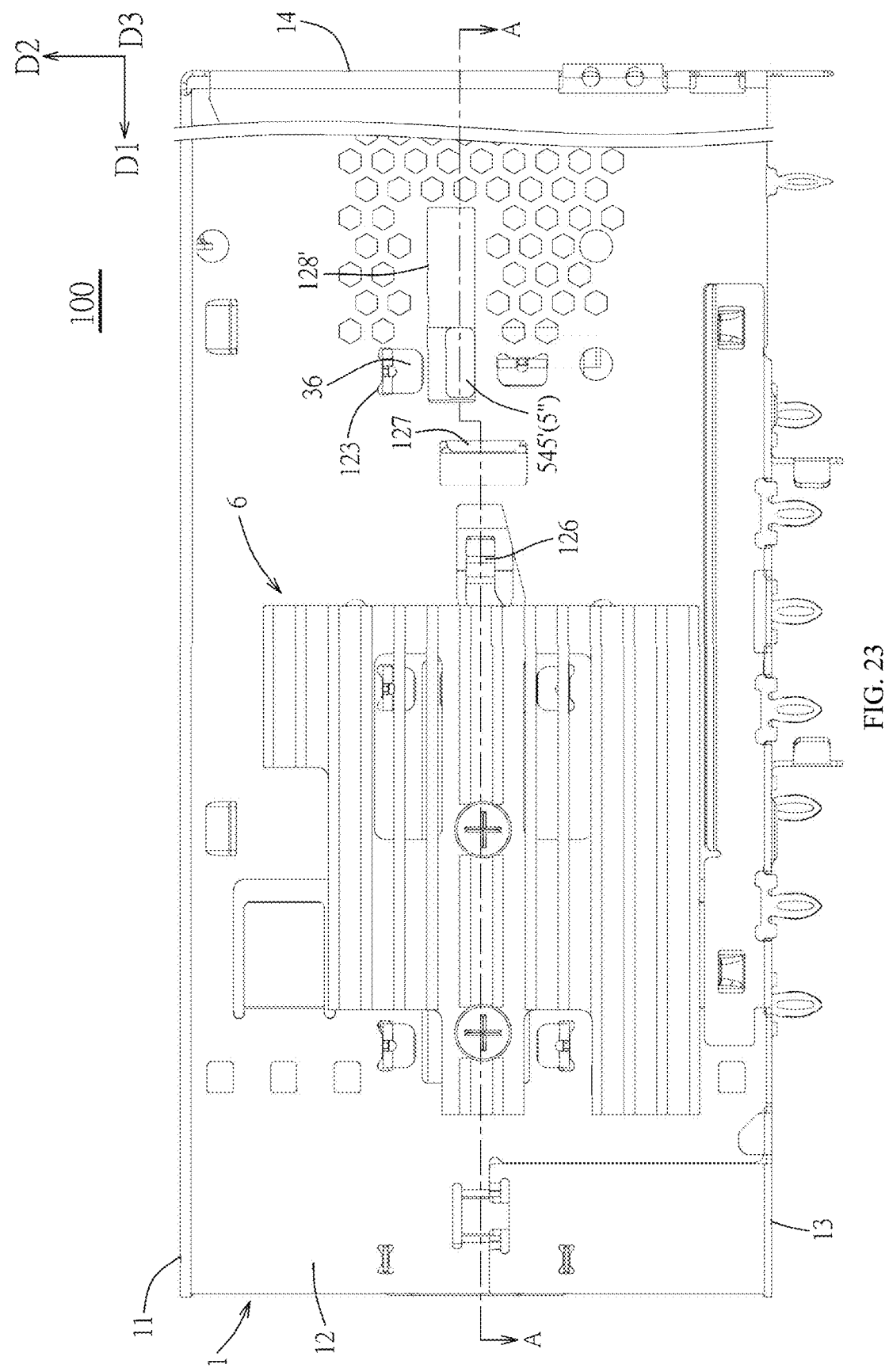
FIG. 23 is a partial broken side view of the third embodiment with the movable heat sink being in the front position.
Figure 24:
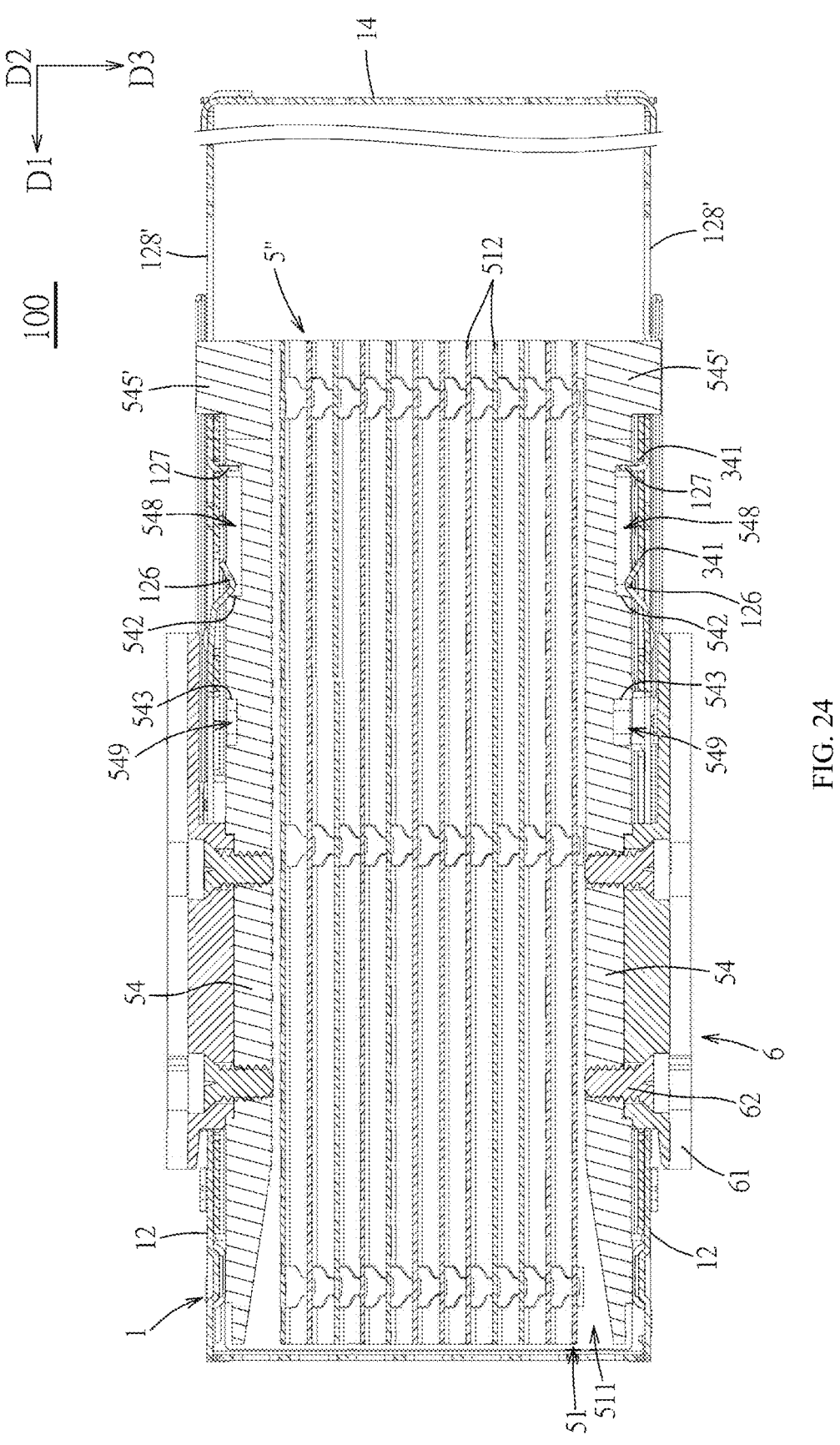
FIG. 24 is a stepped cross sectional view partially broken and taken along a line A-A of FIG. 23 with the movable heat sink being in the front position.
Figure 25:
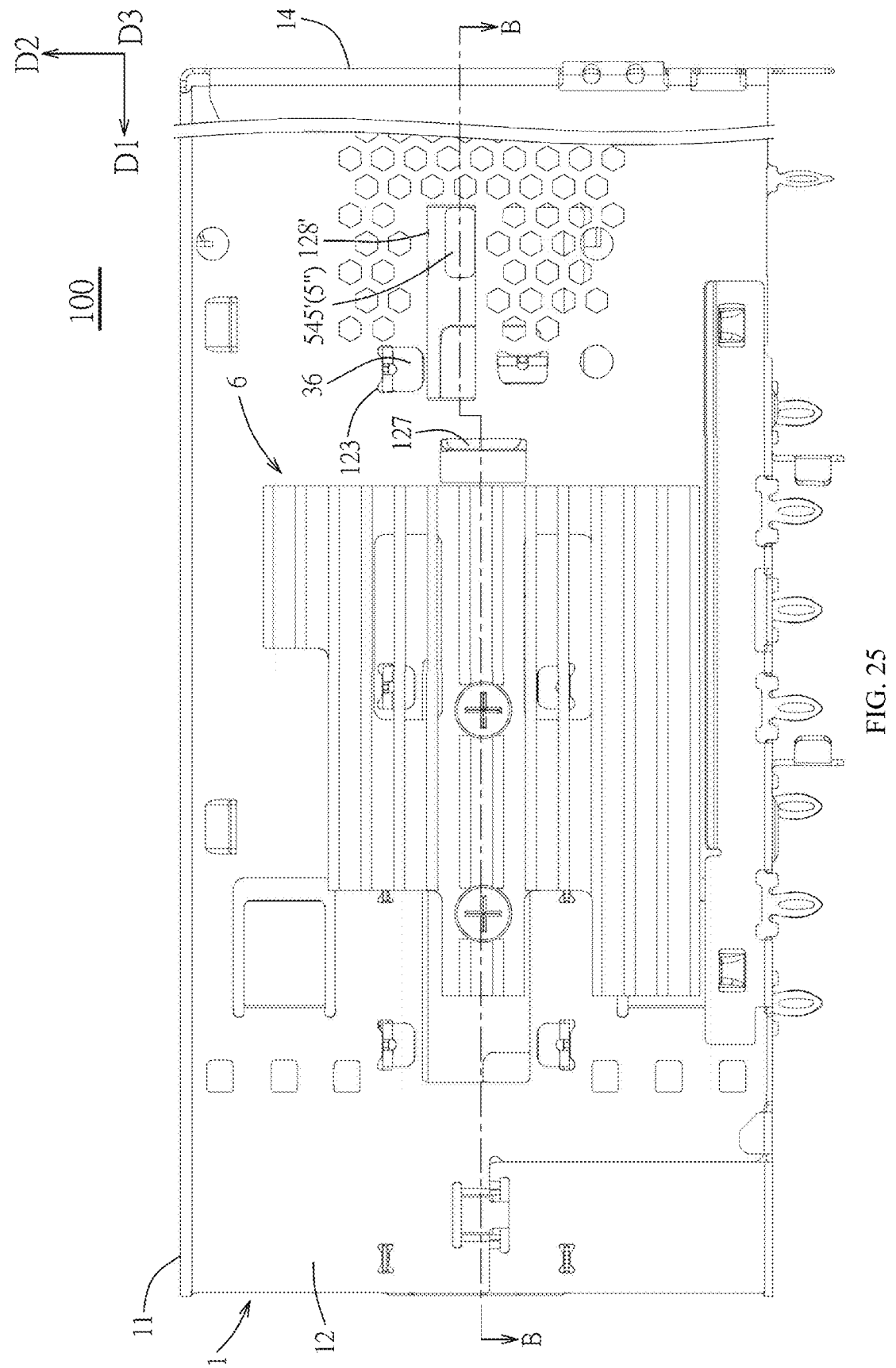
FIG. 25 is a partially broken side view of the third embodiment with the movable heat sink being in the rearward position.
Figure 26:
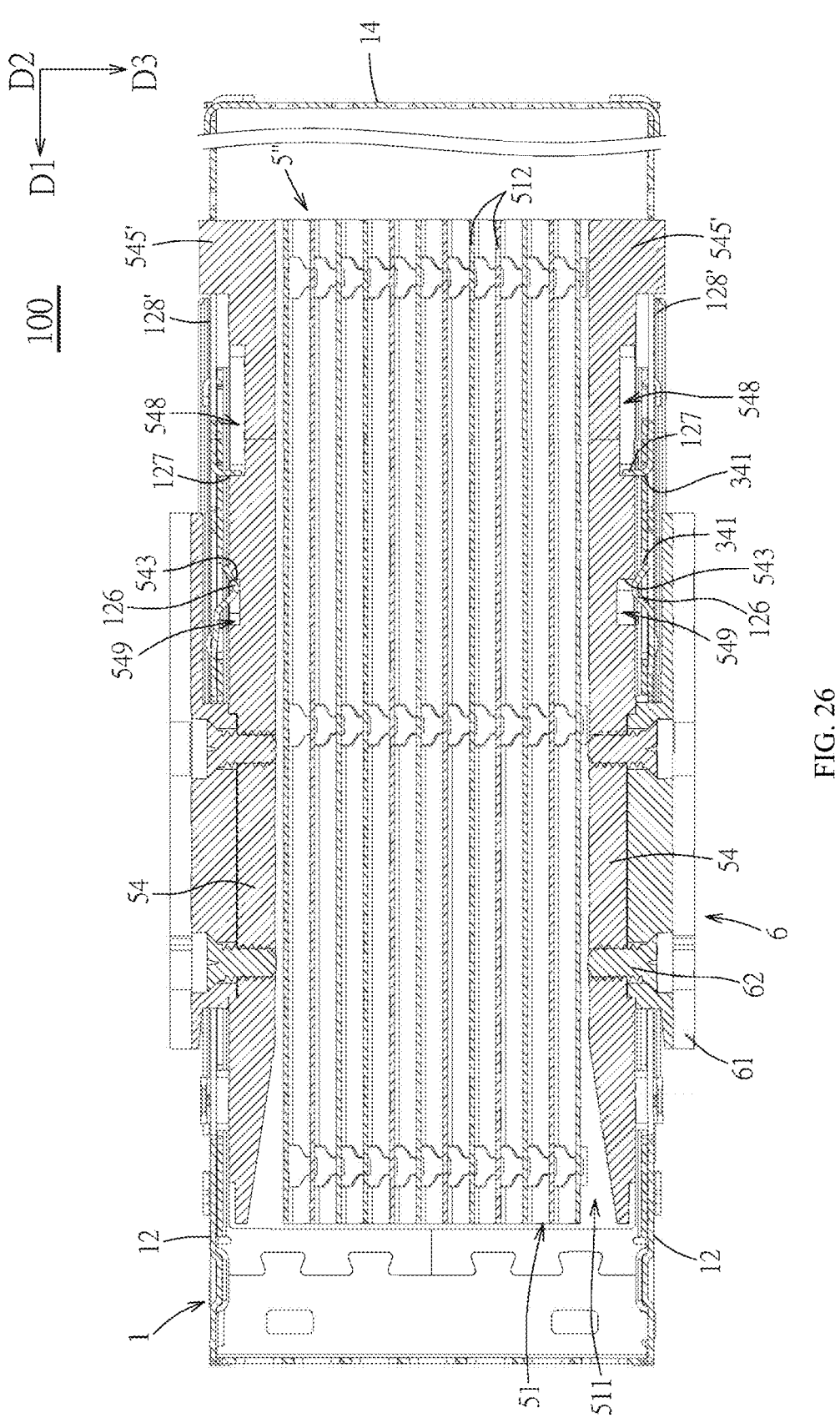
FIG. 26 is a stepped cross sectional view partially broken and taken along a line B-B of FIG. 25 with the movable heat sink being in the rearward position.

Referring to FIG. 21, FIG. 23 and FIG. 24, when the movable heat sink 5" is positioned in the front position, the elastic holding piece (the holding member 126) latches with the front end of the first recessed groove 548 (the first holding portion 542), the limiting piece 127 positioned to the rear end of the first recessed groove 548; referring to FIG. 22, FIG. 25 and FIG. 26, when the movable heat sink 5" is positioned in the rearward position, the elastic holding piece (the holding member 126) latches with the rear end of the second recessed groove 549 (the second holding portion 543), the limiting piece 127 is positioned to the front end of the first recessed groove 548.

Figure 16:
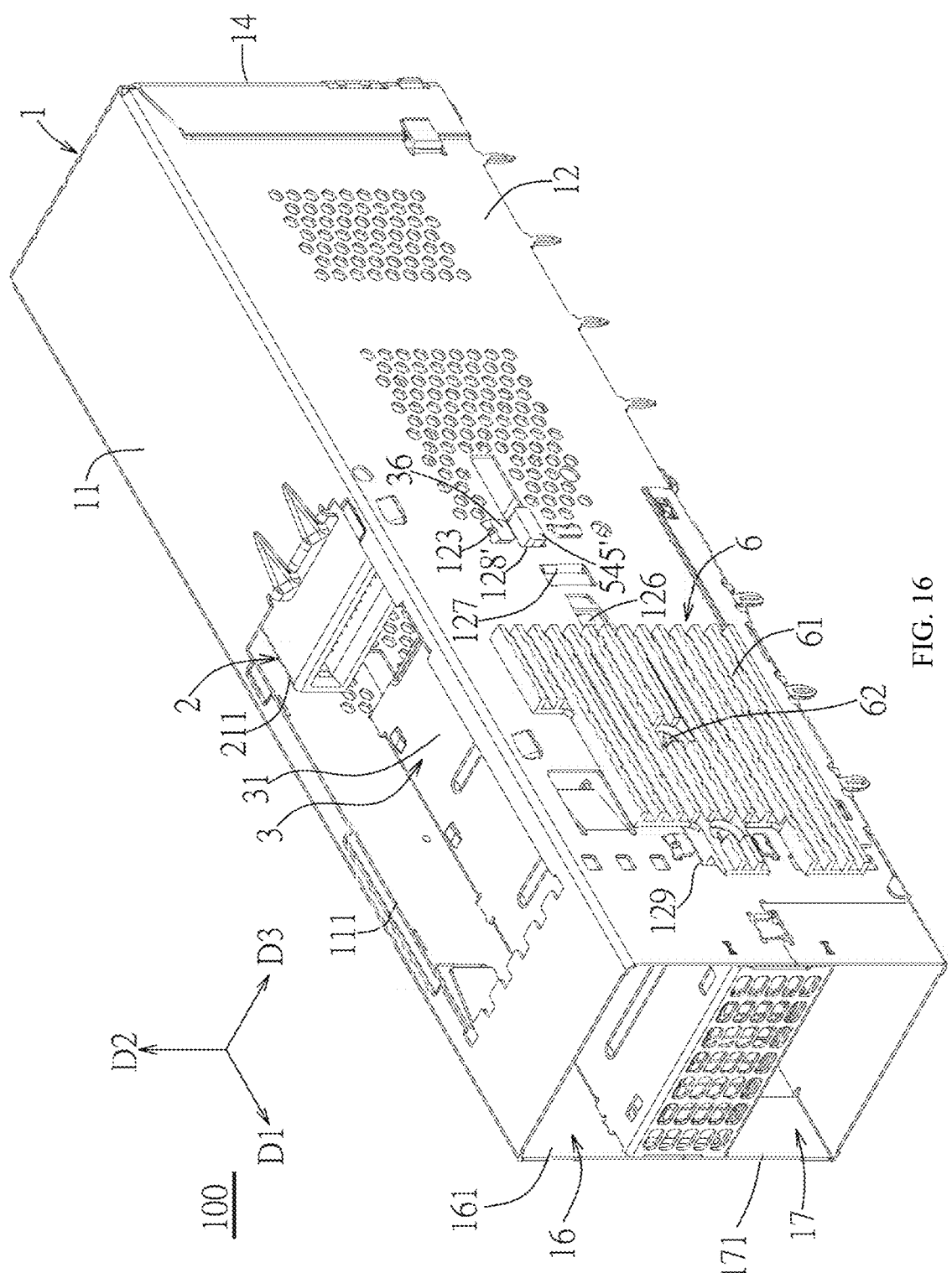
FIG. 16 is a perspective view of a third embodiment of the connector assembly of the present disclosure with an upper heat sink and a lower heat dissipating member omitted.
Figure 17:
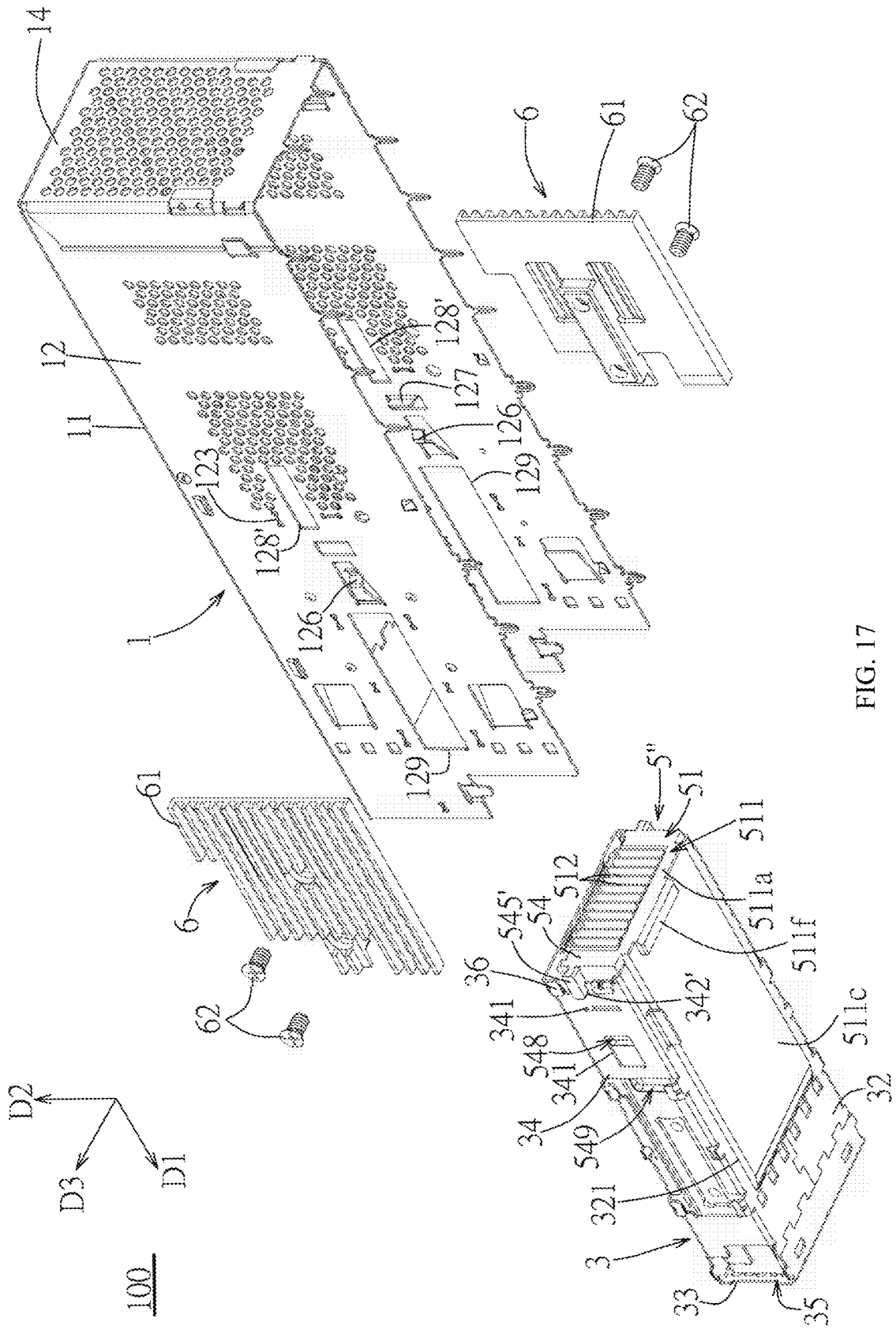
FIG. 17 is a perspective exploded view of FIG. 16 with a receptacle connector further omitted.

Referring to FIG. 16 and FIG. 17, moreover, in the third embodiment, the two side heat sinks 6 are provided to the two side walls 54 of the movable heat dissipating member 51 of the movable heat sink 5" respectively from outer sides of the two side walls 12 of the guiding shield cage 1 by means of the two side wall openings 129, and the two side heat sinks 6 can move together with the movable heat sink 5". Each side heat sink 6 includes a side heat dissipating member 61 and two screwing members 62 which fix the side heat dissipating member 61 to two screwing holes of the corresponding side wall 54, the two side heat sinks 6 can synergize with the movable heat dissipating member 51 of the movable heat sink 5" for heat dissipating, so as to enhance heat dissipating efficiency.

In conclusion, in the present disclosure, by the movable heat sink 5, 5', 5" which is assembled in the partitioning bracket 3 and can move to the front position where the movable heat sink 5, 5', 5" is positioned in front of the upper receptacle 211 and the lower receptacle 212, the partitioning bracket 3 and the movable heat sink 5, 5', 5" do not interfere with the receptacle connector 2 when the partitioning bracket 3 and the movable heat sink 5, 5', 5" are assembled. After the assembling is completed, the movable heat sink 5, 5', 5" is moved rearwardly to the rearward position where the movable heat sink 5, 5', 5" enters into between the upper receptacle 211 and the lower receptacle 212 of the receptacle connector 2, by that the movable heat sink 5, 5', 5" moves toward the receptacle connector 2, a distance for heat dissipating function can be lengthened and a range where heat dissipating is performed is enlarged, in turn heat dissipating efficacy is promoted.

However, what is described above is just the embodiments of the present disclosure, which is not intended to limit the scope implementing the present disclosure, any simple equivalent variations and modifications made according to the claims and the specification of the present disclosure will also be fallen within the scope of the present disclosure.

What is claimed is:

1. A connector assembly, comprising:
a guiding shield cage comprising a limiting piece on a side wall;
a receptacle connector provided to a rear segment of an interior of the guiding shield cage, the receptacle connector having an upper receptacle and a lower receptacle;
a partitioning bracket provided in the guiding shield cage, the partitioning bracket and the guiding shield cage together defining an upper receiving space which corresponds to the upper receptacle and a lower receiving space which corresponds to the lower receptacle; and
a movable heat sink assembled to the partitioning bracket, the movable heat sink comprising a limiting groove in a side wall of the movable heat sink, wherein:
the movable heat sink is capable of moving relative to the partitioning bracket between a front position where the limiting piece is positioned at a rear end of the limiting groove and the movable heat sink is positioned in front of the receptacle connector and a rearward position where the limiting piece is positioned at a front end of the limiting groove and the movable heat sink at least partially enters into a space between the upper receptacle and the lower receptacle of the receptacle connector.

2. The connector assembly of claim 1, wherein
the movable heat sink further comprises guiding members,
the guiding shield cage further comprises guiding rail grooves, and
the guiding members are respectively provided to the guiding rail grooves in a manner that the guiding members can slide forwardly or rearwardly.

3. The connector assembly of claim 2, wherein
two side walls of the movable heat sink have the guiding members, and
the two side walls of the guiding shield cage have the guiding rail grooves.

4. The connector assembly of claim 3, wherein
the partitioning bracket further comprises guiding member receiving notches provided on two side walls of the partitioning bracket, and
when the movable heat sink is positioned in the front position, the guiding members of the movable heat sink are received in the guiding member receiving notches.

5. The connector assembly of claim 1, wherein
the movable heat sink further comprises a lower stopping portion which enters into the lower receiving space, and
when the movable heat sink is in the front position, a pluggable module which enters into the lower receiving space is capable of pushing the lower stopping portion so that the movable heat sink is rearwardly moved to the rearward position.

6. The connector assembly of claim 1, wherein
the connector assembly further comprises side heat sinks, and
the side heat sinks are positioned to outer sides of two side walls of the guiding shield cage respectively and are assembled to the two side walls of the movable heat sink in a manner that the side heat sinks move together with the movable heat sink.

7. The connector assembly of claim 1, wherein
the movable heat sink comprises a movable heat dissipating member and a movable pressure-applying spring, and
the movable pressure-applying spring applies an elastic force to the movable heat dissipating member so that the movable heat dissipating member is capable of being elastically moved upwardly or downwardly relative to the partitioning bracket.

8. The connector assembly of claim 7, wherein
the movable pressure-applying spring is assembled to the movable heat dissipating member and moves together with the movable heat dissipating member,
the movable pressure-applying spring is positioned between the movable heat dissipating member and an upper wall of the partitioning bracket, and
the movable pressure-applying spring has a plurality of plate-shaped spring pieces which press against the upper wall of the partitioning bracket.

9. A connector assembly, comprising:
a guiding shield cage;
a receptacle connector provided to a rear segment of an interior of the guiding shield cage, the receptacle connector having an upper receptacle and a lower receptacle;
a partitioning bracket provided in the guiding shield cage, the partitioning bracket and the guiding shield cage together defining an upper receiving space which corresponds to the upper receptacle and a lower receiving space which corresponds to the lower receptacle; and
a movable heat sink assembled to the partitioning bracket, wherein:
the movable heat sink is capable of moving relative to the partitioning bracket between a front position where the movable heat sink is positioned in front of the receptacle connector and a rearward position where the movable heat sink at least partially enters into a space between the upper receptacle and the lower receptacle of the receptacle connector,
the connector assembly further comprises holding members,
the movable heat sink further comprises first holding portions provided on two side walls of the movable heat sink which latch with the holding members when the movable heat sink is in the front position, and
the movable heat sink further comprises second holding portions provided on the two side walls of the movable heat sink which latch with the holding members when the movable heat sink is in the rearward position.

10. The connector assembly of claim 9, wherein the holding members comprise elastic holding pieces which are constructed on two side walls of the guiding shield cage or two side walls of the partitioning bracket, the two side walls of the movable heat sink each are formed with a first recessed groove and a second recessed groove which is positioned in front of the first recessed groove, the first holding portions are front ends of the first recessed grooves constructed on the two side walls of the movable heat sink, and the second holding portions are rear ends of the second recessed grooves constructed on the two side walls of the movable heat sink.

11. The connector assembly of claim 10, wherein the guiding shield cage further comprises a second limiting piece on a second side wall of the guiding shield cage, the movable heat sink further comprises a second limiting groove on a second side wall of the movable heat sink, when the movable heat sink positioned in the front position, the limiting piece and the second limiting piece are positioned to rear ends of the limiting groove and the second limiting groove, and when the movable heat sink is positioned in the rearward position, the limiting piece and the second limiting piece are positioned to front ends of the limiting groove and the second limiting groove.

12. The connector assembly of claim 11, wherein the two side walls of the guiding shield cage have the elastic holding pieces, and the two side walls of the partitioning bracket have avoiding openings which allow the elastic holding pieces to pass through.

13. A connector assembly, comprising:

a guiding shield cage;

a receptacle connector provided to a rear segment of an interior of the guiding shield cage, the receptacle connector having an upper receptacle and a lower receptacle; and a partitioning bracket provided in the guiding shield cage, the partitioning bracket and the guiding shield cage together defining an upper receiving space which corresponds to the upper receptacle and a lower receiving space which corresponds to the lower receptacle;

an internal heat sink provided in the partitioning bracket; and a movable heat sink assembled to a rear end of the partitioning bracket and positioned behind the internal heat sink, the movable heat sink being capable of moving relative to the partitioning bracket between a front position where the movable heat sink is positioned in front of a front end of the upper receptacle and a front end of the lower receptacle and a rearward position where the movable heat sink at least partially enters into a space between the upper receptacle and the lower receptacle.

14. The connector assembly of claim 13, wherein the movable heat sink further comprises guiding members, the guiding shield cage further comprises guiding rail grooves, and the guiding members are respectively provided to the guiding rail grooves in a manner that the guiding members can slide forwardly or rearwardly.

15. The connector assembly of claim 14, wherein two side walls of the movable heat sink have the guiding members, and the two side walls of the guiding shield cage have the guiding rail grooves.

16. The connector assembly of claim 15, wherein the partitioning bracket further comprises guiding member receiving notches provided on two side walls of the partitioning bracket, and when the movable heat sink is positioned in the front position, the guiding members of the movable heat sink are received in the guiding member receiving notches.

17. The connector assembly of claim 14, wherein the movable heat sink comprises a movable heat dissipating member and a movable pressure-applying spring, the movable pressure-applying spring comprises a movable supporting frame and a movable pressure-applying elastic piece, the movable heat dissipating member is assembled in the movable supporting frame, the movable supporting frame has an upper wall and two side walls, the movable pressure-applying elastic piece is provided to the upper wall of the movable supporting frame, and applies an elastic force to the movable heat dissipating member so that the movable heat dissipating member is capable of being elastically moved upwardly or downwardly relative to the movable supporting frame and the partitioning bracket, and two side walls of the movable supporting frame are constructed the two side walls of the movable heat sink.

18. The connector assembly of claim 14, wherein the movable heat sink comprises a movable heat dissipating member and a movable pressure-applying spring, the movable heat dissipating member has a base and heat dissipating fins, the base has a lower wall and two side walls, the movable pressure-applying spring is positioned between the movable heat dissipating member and an upper wall of the partitioning bracket and applies an elastic force to the movable heat dissipating member so that the movable heat dissipating member is capable of being elastically moved upwardly or downwardly relative to the partitioning bracket, and two side walls of the base are constructed as the two side walls of the movable heat sink.

19. The connector assembly of claim 13, wherein the connector assembly further comprises holding members, the movable heat sink further comprises first holding portions provided on two side walls of the movable heat sink which latch with the holding members when the movable heat sink is in the front position, and the movable heat sink further comprises second holding portions provided on the two side walls of the movable heat sink which latch with the holding members when the movable heat sink is in the rearward position.

20. The connector assembly of claim 19, wherein the holding members comprise elastic holding pieces which are constructed on two side walls of the guiding shield cage, the first holding portions comprise limiting holes which are constructed on the two side walls of the movable heat sink, and

the second holding portions comprise front edge which are constructed on the two side walls of the movable heat sink respectively.

21. The connector assembly of claim 20, wherein the movable heat sink further comprises limiting grooves provided on two side walls of the movable heat sink, the two side walls of the guiding shield cage or the two side walls of the partitioning bracket have limiting pieces which correspondingly enter into the limiting grooves, when the movable heat sink is positioned in the front position, the limiting pieces are positioned to rear ends of the limiting grooves, and when the movable heat sink is positioned in the rearward position, the limiting pieces are positioned to front ends of the limiting grooves.

22. The connector assembly of claim 21, wherein the two side walls of the guiding shield cage have the limiting pieces which correspondingly enter into the limiting grooves, and the two side walls of the partitioning bracket each have avoiding openings which respectively allow the corresponding elastic holding pieces and the corresponding limiting piece to pass through.

23. The connector assembly of claim 13, wherein the movable heat sink further comprises a lower stopping portion which enters into the lower receiving space, and when the movable heat sink is in the front position, a pluggable module which enters into the lower receiving space is capable of pushing the lower stopping portion so that the movable heat sink is rearwardly moved to the rearward position.

24. The connector assembly of claim 13, wherein the internal heat sink comprises an internal heat dissipating member and an internal pressure-applying spring, and the internal pressure-applying spring is positioned between the internal heat dissipating member and an upper wall of the partitioning bracket, and applies an elastic force to the internal heat dissipating member so that the internal heat dissipating member is capable of being elastically moved upwardly or downwardly relative to the partitioning bracket.

* * * * *